(12) United States Patent
Divigalpitiya et al.

(10) Patent No.: US 9,668,333 B2
(45) Date of Patent: May 30, 2017

(54) ELECTRICALLY CONDUCTIVE ARTICLE WITH HIGH OPTICAL TRANSMISSION

(71) Applicant: 3M INNOVATIVE PROPERTIES COMPANY, St. Paul, MN (US)

(72) Inventors: Ranjith Divigalpitiya, London (CA); Mark J. Pellerite, Woodbury, MN (US); John P. Baetzold, North St. Paul, MN (US); Gary A. Korba, Woodbury, MN (US); Mieczyslaw H. Mazurek, Roseville, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 189 days.

(21) Appl. No.: 14/356,914

(22) PCT Filed: Dec. 12, 2012

(86) PCT No.: PCT/US2012/069091
§ 371 (c)(1),
(2) Date: May 8, 2014

(87) PCT Pub. No.: WO2013/096036
PCT Pub. Date: Jun. 27, 2013

(65) Prior Publication Data
US 2014/0299364 A1 Oct. 9, 2014

Related U.S. Application Data

(60) Provisional application No. 61/579,320, filed on Dec. 22, 2011.

(51) Int. Cl.
*H05K 1/00* (2006.01)
*H05K 1/02* (2006.01)
(Continued)

(52) U.S. Cl.
CPC ............. *H05K 1/02* (2013.01); *B82Y 10/00* (2013.01); *H01L 31/022466* (2013.01);
(Continued)

(58) Field of Classification Search
CPC ....... B29B 15/12; B29C 70/025; B82Y 10/00; B82Y 30/00; C09D 5/24; C09D 7/1266;
(Continued)

(56) References Cited

U.S. PATENT DOCUMENTS 5,554,659 A 9/1996 Rosenblatt
6,511,701 B1 1/2003 Divigalpitiya
(Continued)

FOREIGN PATENT DOCUMENTS

CN 1414818 4/2003
CN 101945710 1/2011
(Continued)

OTHER PUBLICATIONS

Intercalation and Exfoliation Routes to Graphite Nanoplatelets-Viculis et al. Nov. 2004.*
(Continued)

*Primary Examiner* — Timothy Thompson
*Assistant Examiner* — Guillermo Egoavil
(74) *Attorney, Agent, or Firm* — Adrian L. Pishko

(57) ABSTRACT

A transparent conductive article includes a transparent substrate, a thin electrically conductive grid, and a carbon nanolayer. The grid is disposed on the substrate, and the carbon nanolayer is also disposed on the substrate and in contact with the grid. The conductive grid and the carbon nanolayer may have thicknesses of no more than 1 micron and 50 nanometers, respectively. The carbon nanolayer has a morphology that includes graphite platelets embedded in nano-crystalline carbon, and can be produced with a buffing procedure using dry carbon particles without substantially
(Continued)

damaging the grid structure. The article may have a visible light transmission of at least 80%, and a sheet resistance less than 500 or 100 ohms/square. The transparent substrate may comprise a flexible polymer film. The disclosed articles may substantially maintain an initial sheet resistance value when subjected to flexing.

18 Claims, 15 Drawing Sheets

(51) Int. Cl.
| | |
|---|---|
| *H05K 3/10* | (2006.01) |
| *B82Y 10/00* | (2011.01) |
| *H01L 51/44* | (2006.01) |
| *H01L 31/0224* | (2006.01) |
| *G02F 1/1343* | (2006.01) |
| *H01L 51/00* | (2006.01) |

(52) U.S. Cl.
 CPC .............. *H01L 51/445* (2013.01); *H05K 3/10* (2013.01); *G02F 1/13439* (2013.01); *G02F 2202/36* (2013.01); *H01L 51/0045* (2013.01); *H01L 51/0097* (2013.01); *Y02E 10/549* (2013.01); *Y02P 70/521* (2015.11); *Y10T 29/49155* (2015.01)

(58) Field of Classification Search
 CPC C09D 7/1291; C09K 5/14; D02J 1/18; D04H 3/04; D04H 3/12; D06B 1/04; F28F 21/02; G02F 1/13439; G02F 2202/36; G06F 3/044; H01B 1/24; H01B 13/30; H05K 1/02; H05K 3/10; H05K 7/2039; H01L 23/433; H01L 31/022466; H01L 51/445; H01L 51/0045; H01L 51/0097; H01L 2924/0002; H01M 4/36; H01M 4/661; H01M 4/0416; H01M 4/5825; H01M 4/0404; H01M 4/48; H01M 4/583; H01M 4/667; Y02E 10/542; Y02E 10/549; Y02P 70/521; Y10T 29/49155; Y10T 428/30; Y10T 428/265; Y10T 428/266; Y10T 428/31786; Y10T 428/31855; Y10T 428/31931; Y10T 428/31935; Y10T 428/31938
 USPC ........ 29/846; 165/185; 174/126.1, 254, 268; 251/71; 427/58, 108, 113, 122, 541; 428/336, 337, 375, 426, 480, 521, 522, 428/523; 429/209, 231.5, 231.95; 997/932, 742, 750, 752, 892
 See application file for complete search history.

(56) References Cited

U.S. PATENT DOCUMENTS

| | | | |
|---|---|---|---|
| 6,735,812 B2 | 5/2004 | Hekman et al. | |
| 7,750,555 B2 | 7/2010 | Song | |
| 2002/0108202 A1 | 8/2002 | Leisinger | |
| 2003/0019518 A1 | 1/2003 | Shimizu | |
| 2004/0071625 A1* | 4/2004 | Baker .................... | B82Y 30/00 423/447.3 |
| 2007/0084576 A1 | 4/2007 | Hermans | |
| 2008/0020193 A1* | 1/2008 | Jang ..................... | B29C 70/025 428/292.1 |
| 2008/0023066 A1 | 1/2008 | Hecht | |
| 2008/0100779 A1* | 5/2008 | Choo ................... | G02B 5/3058 349/96 |
| 2008/0259262 A1 | 10/2008 | Jones | |
| 2008/0264482 A1 | 10/2008 | Lee | |
| 2008/0314626 A1 | 12/2008 | Moore | |
| 2009/0295285 A1 | 12/2009 | Tokunaga | |
| 2009/0310742 A1 | 12/2009 | Kim | |
| 2010/0040950 A1 | 2/2010 | Buiel | |
| 2010/0055569 A1 | 3/2010 | Divigalpitiya | |
| 2010/0056819 A1* | 3/2010 | Jang ...................... | B82Y 30/00 556/478 |
| 2010/0263908 A1 | 10/2010 | Lee | |
| 2010/0317790 A1* | 12/2010 | Jang ...................... | B82Y 30/00 524/496 |
| 2011/0001054 A1 | 1/2011 | Frank | |
| 2011/0001905 A1 | 1/2011 | Tanaka | |
| 2011/0014410 A1 | 1/2011 | Kishioka | |
| 2011/0024158 A1* | 2/2011 | Tsotsis ..................... | H01B 1/24 174/126.1 |
| 2011/0052926 A1 | 3/2011 | Nakamura | |
| 2011/0273085 A1 | 11/2011 | Garbar | |
| 2011/0281509 A1* | 11/2011 | Tanaka .................. | B24B 37/042 451/388 |
| 2012/0015852 A1* | 1/2012 | Quintero ................ | C09K 8/032 507/112 |
| 2012/0021149 A1* | 1/2012 | Myli ................... | C03C 17/3411 428/34 |
| 2012/0148835 A1* | 6/2012 | Radkowski ............ | B82Y 30/00 428/336 |
| 2013/0033343 A1* | 2/2013 | Fisher ..................... | H01J 23/36 333/252 |
| 2013/0048339 A1* | 2/2013 | Tour ........................ | H01B 1/04 174/126.1 |
| 2013/0323503 A1* | 12/2013 | Radkowski ............ | B82Y 30/00 428/336 |
| 2014/0345843 A1* | 11/2014 | Kirkor .................... | F28F 23/00 165/185 |

FOREIGN PATENT DOCUMENTS

| | | |
|---|---|---|
| EP | 0481757 | 4/1992 |
| EP | 0684652 | 11/1995 |
| JP | 2008-288102 | 11/2008 |
| JP | 2008288102 A * | 11/2008 |
| JP | 2009-211978 | 9/2009 |
| JP | 2009211978 A * | 9/2009 |
| JP | 2010-093099 | 4/2010 |
| JP | 2011-021109 | 2/2011 |
| JP | 2011-096975 | 5/2011 |
| JP | 2011-171015 | 9/2011 |
| KR | 2007-0099787 | 10/2007 |
| WO | WO 2009/086161 | 7/2009 |
| WO | WO 2009-151197 | 12/2009 |
| WO | WO 2010-025052 | 3/2010 |
| WO | WO 2011/112589 | 9/2011 |
| WO | WO 2011-112598 | 9/2011 |
| WO | WO 2012/076473 | 6/2012 |
| WO | WO 2012-078464 | 6/2012 |

OTHER PUBLICATIONS

Structural Phases of Disordered Carbon Materials_by Dallas-1996.*
"Graphite & Other Powders for the Manufacture of Lubricants and Greases", Asbury Graphite Mills, Inc., Oct. 2003, 1 page.
"NanoMarkets Issues New Report on ITO and Alternative Transparent Conductors", Nano Markets, Jun. 14, 2010, 2 pages.
International Search Report for PCT International Application No. PCT/US2012/069091 mailed on Apr. 1, 2013, 4 pages.
Supplementary European Search Report, EP Application No. 12858752, dated Jul. 14, 2015, 3 pages.

* cited by examiner

ELECTRICALLY CONDUCTIVE ARTICLE WITH HIGH OPTICAL TRANSMISSION

CROSS REFERENCE TO RELATED APPLICATIONS

This application is a national stage filing under 35 U.S.C. 371 of PCT/US2012/069091, filed Dec. 12, 2012, which claims priority to Provisional Application No. 61/579,320, filed Dec. 22, 2011, the disclosure of which is incorporated by reference in its/their entirety herein.

FIELD OF THE INVENTION

This invention relates generally to electrically conductive films that have a high degree of transmission for visible light. The invention also relates to associated articles, systems, and methods.

BACKGROUND

Transparent conductors are known, and are used in a variety of applications such as displays, touch panels, and photovoltaic systems. The material most commonly used for transparent conductors is indium tin oxide (ITO).

Although ITO is acceptable as a transparent conductor in many applications, for some applications it may not be acceptable or optimal. In some cases, the ITO may be unable to provide a sufficiently high optical transparency and/or a sufficiently high electrical conductivity. In some cases, the tendency of indium ions in the ITO to migrate to adjacent structures may be undesirable. In some cases, the ITO may be subjected to a degree of flexing that may degrade electrical conductivity due to brittleness of the ITO. In some cases, the cost of the ITO may be undesirable or prohibitive, as a result of unstable supply and/or increased demand for indium.

BRIEF SUMMARY

We have developed a family of articles that can be tailored to provide high electrical conductivity (low electrical resistivity) in combination with high optical transmission over visible wavelengths. Furthermore, these articles can have associated characteristics that may be considered advantageous relative to ITO and/or other known transparent conductors. For example, the disclosed transparent conductive articles can be tailored to have sheet resistances of less than 500, 100, 50, 25, or 10 ohms/square while also having a transmission over visible wavelengths of at least 80%. The articles can be tailored to be robust with respect to repeated flexing, e.g., having a resistivity that is maintained within a factor of 2 of an initial resistivity when subjected to a specified degree of flexing for a specified period of time. The articles are compatible with high volume manufacturing processes, e.g., processes in which a flexible polymer film or similar substrate, optionally in the form of a roll good, is processed in a continuous or semi-continuous fashion at a series of stations on a film line.

The present application therefore discloses, inter alia, transparent conductive articles that include a transparent substrate, an electrically conductive grid disposed on the substrate, and a carbon nanolayer disposed on the substrate and in contact with the grid. The grid preferably has a thickness of no more than 1 micrometer, and the carbon nanolayer preferably has a thickness of no more than 50 or 20 nanometers. The carbon nanolayer also preferably has a morphology comprising graphite platelets embedded in nano-crystalline carbon.

In some cases, the article has a spatially averaged optical transmission of at least 80% at 550 nm, and/or a spatially averaged optical transmission of at least 80% when averaged over the visible wavelength range from 400 to 700 nm, and/or a spatially averaged optical transmission of at least 80% over the entire visible wavelength range from 400 to 700 nm. In some cases, the carbon nanolayer and the grid provide the article with a sheet resistance less than 500 ohms/square, or less than 100 ohms/square, or less than 50 ohms/square, or even less than 25 or 10 ohms/square.

The article may be flexible, and the carbon nanolayer and the grid may provide the article with an initial sheet resistance. Such flexible article may then be subjected to substantial flexing, e.g., flexing characterized by a bending diameter of 1 cm. After 60 seconds of such flexing, the sheet resistance of exemplary transparent conductive articles does not substantially increase. For example, the sheet resistance may not increase beyond two times the initial value of the sheet resistance after such flexing.

In some cases the grid is disposed between the substrate and the carbon nanolayer. In other cases, the carbon nanolayer is disposed between the substrate and the grid.

The grid may be configured as desired, e.g., in a regular repeating pattern, or in a non-repeating pattern, such as a random pattern or semi-random pattern. Aspects of the grid can be tailored to provide a desired combination of high optical transmission and low sheet resistance. One significant design parameter of the grid in this regard is the percent open area, e.g., the fraction or percentage of a spatial region, when viewed in plan view, that is not occupied by the constituent segments or parts of the grid, where the spatial region is large compared to a characteristic dimension of the grid. The grid may have a percent open area of at least 90%, for example. In some cases the grid may be a first electrically conductive grid, and the article may further include a second electrically conductive grid disposed on the substrate, the first and second grids being electrically isolated from each other. The grid may be composed of a material other than ITO having a conductivity of at least $10^4$ Siemens/meter. The grid material may be or comprise a metal selected from aluminum, silver, gold, copper, nickel, titanium, chromium, indium, and alloys thereof. Other grid materials can also be used.

Preferably, the carbon nanolayer functions as an electric field spreading layer.

The article may be in the form of a relatively long and relatively wide roll of material. For example, the article may have a first dimension along a first in-plane axis, such as a down-web direction, of at least 1 meter, or at least 10 meters, or at least 100 meters. The article may also then have a second dimension along a second in-plane axis that is orthogonal to the first in-plane axis (the second in-plane axis may thus be a cross-web direction) of at least 0.1 meter, or at least 0.5 meters, or at least 1 meter.

We also disclose methods of making transparent conductive articles, where such methods may include: providing a first substrate; forming an electrically conductive grid on the substrate to provide an intermediate article, the grid having a thickness of no more than 1 micrometer; applying a dry composition that includes carbon particles to the intermediate article; and buffing the dry composition on the intermediate article to form a transparent carbon nanolayer that covers the grid and the substrate, while maintaining the grid's physical integrity.

In such methods, the first substrate may be or include a transparent flexible film. The carbon nanolayer may have a thickness of no more than 50 or 20 nm, and preferably has a morphology comprising graphite platelets embedded in nano-crystalline carbon.

In some cases, the first substrate may be or include a release liner, and the method may further include transferring the grid and the transparent carbon nanolayer from the first substrate to a second substrate. The second substrate may also be or include a transparent flexible film.

Related methods, systems, and articles are also discussed.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF DRAWINGS

In the figures, like reference numerals designate like elements.

FIG. 7a is a schematic side- or cross-sectional view of the device of FIG. 7 along lines 7a-7a;

DETAILED DESCRIPTION OF ILLUSTRATIVE EMBODIMENTS

As used herein, "graphite platelet" refers to a graphitic carbon material having a first order laser Raman spectrum that exhibits two absorption bands including a sharp, intense band (G peak) centered at about 1570-1580 cm$^{-1}$, and a broader, weak band (D peak) centered at about 1320-1360 cm$^{-1}$.

As used herein, "nano-crystalline carbon" refers to a graphitic carbon material having a first order laser Raman spectrum that exhibits two absorption bands including a pair of weak bands (G peaks) centered at about 1591 cm$^{-1}$ and 1619 cm$^{-1}$, respectively, and a sharp, intense band (D peak) centered at about 1320-1360 cm$^{-1}$.

Figure 1:
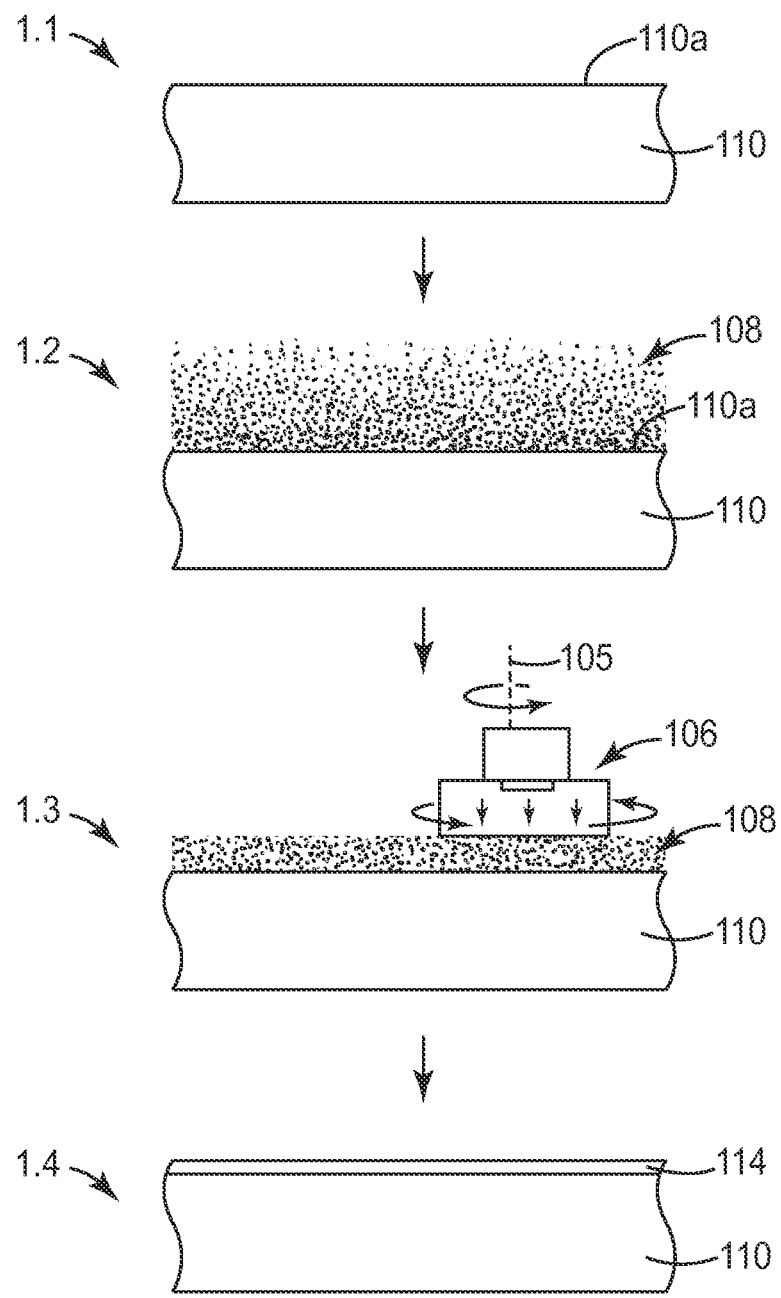
FIG. 1 is a collection of schematic side- or cross-sectional views depicting a buff-coating process for forming a carbon nanolayer on a substrate.

In FIG. 1 we see a collection of views depicting a buff-coating process for forming a carbon nanolayer on a substrate. In step 1.1 of this process, a substrate 110 is provided. The substrate may be rigid or flexible, but typically it at least has a sufficient mechanical integrity to be self-supporting. In exemplary embodiments the substrate 110 may be or include a flexible, transparent polymer film such as polyethylene terephthalate (PET) or polyethylene naphthalate (PEN). In some cases, the substrate may be non-flexible or rigid, as in the case of a glass plate. The substrate may consist essentially of only one layer of material, or it may have a multilayered construction. The substrate has an exposed major surface 110a on which the carbon nanolayer will be formed.

In step 1.2, a dry composition 108 is applied to the surface 110a. The dry composition 108 can include carbon particles and additional components such as polymeric microspheres and/or other microspheres. The carbon can be any form or type of carbon. Exemplary carbons include conductive carbons such as graphite, carbon black, lamp black, or other conductive carbon materials. Typically, exfoliatable carbon particles, i.e., those that break up into flakes, scales, sheets, or layers upon application of shear force, are used. An example of useful exfoliatable carbon particles is HSAG300 graphite particles, available from Timcal Graphite and Carbon, Bodio, Switzerland. Other useful materials include but are not limited to SUPER P and ENSACO (Timcal). The carbon particles can also be or comprise carbon nanotubes, including multi-walled carbon nanotubes. The carbon particles of the composition 108 may have a Mohs' hardness between 0.4 and 3.0 and a largest dimension of less than about 100 microns.

In connection with the dry composition 108, "dry" means free or substantially free of liquid. Thus, the composition 108 is provided in a solid particulate form, rather than in a liquid or paste form. The use of dry particles, rather than particles provided in a liquid or paste, is considered important in obtaining an optimal carbon nanolayer.

In step 1.3, mechanical buffing device 106 is used to lightly buff the dry composition 108 against the surface 110a. An applicator pad of the device 106 moves in a rapid orbital motion about a rotational axis 105 and presses lightly against the surface 110a, e.g., with a pressure normal to the surface 110a greater than zero and less than about 30 g/cm$^2$. The orbiting applicator pad can also be moved in the plane of the substrate 110 parallel to the surface 110a. Such in-plane motion of the applicator pad may be used to ensure complete buffing of the entire surface 110a. In cases where the substrate 110 is a web of material moving past the buffing device 106, the orbiting applicator pad can thus be made to move in both cross-web and down-web directions. The buffing motion can be a simple orbital motion or a random orbital motion. A typical orbital motion is in the range of 50 to 10,000 revolutions per minute.

Commercially available electric orbital sanders, such as the model BO4900V Finishing Sander, marketed by Makita, Inc., may be used as the buffing device 106. An applicator pad for such a device may be made of any appropriate material for applying particles to a surface. The applicator pad may, for example, be made of woven or non-woven fabric or cellulosic material. The applicator pad may alternatively be made of a closed cell or open cell foam material. In other cases, the applicator pad may be made of brushes or an array of nylon or polyurethane bristles. Whether the applicator pad comprises bristles, fabric, foam, and/or other structures, it typically has a topography wherein particles of the dry composition can become lodged in and carried by the applicator pad.

In this regard, the dry composition 108 can be applied to the surface 110a of substrate 110 in a number of ways. In one approach, the composition 108 can first be applied directly to the surface 110a, and then the applicator pad of buffing device 106 may contact the composition 108 and surface 110a. In another approach, the composition 108 can first be applied to the applicator pad of buffing device 106, and the particle-loaded applicator pad may then contact the surface 110a. In still another approach, a portion of the composition 108 can be applied directly to the surface 110a, and another portion of the composition 108 can be applied to the applicator pad of buffing device 106, after which the particle-loaded applicator pad may contact the surface 110a and remainder of the composition 108. In all of these cases, the reader will understand that the dry composition 108 is applied to the surface 110a of the substrate 110.

The buffing operation of step 1.3 can be used to produce a high quality thin carbon nanolayer 114 on the surface 110a of the substrate 110, as shown in step 1.4. The thickness of the buffed nanolayer 114 can be controlled by controlling the buffing time. Generally, the thickness of the coating increases linearly with buffing time after a certain rapid initial increase. Thus, the longer the buffing operation, the thicker the coating. The coating thickness of the nanolayer 114 can also be controlled by controlling the amount of dry powder composition 108 used during the buffing operation. The sheet resistance of the nanolayer 114 can range widely, e.g., from about 1000 ohms/square to about $10^{12}$ ohms/square, depending on the thickness and quality of the coating. In exemplary embodiments, the nanolayer 114 can be tailored to be no more than 50, 20, 15, 10, or 5 nanometers thick, and is preferably at least 0.5 nanometers thick, such that its transmission over visible wavelengths is reasonably high, e.g., at least 50, 60, 70, or 80% at 550 nm or over the visible wavelength range. Typically, the nanolayer 114 is not single layer graphene, and has a more complex morphology as discussed below in connection with FIG. 5. A nanolayer 114 fabricated in this way can be tailored to have a high optical transmission and relatively low sheet resistance, as explained further below.

One, some, or all of steps 1.1 through 1.4 may be carried out using batch processes on a substrate of limited size. Alternatively, one, some, or all of the steps may be carried out as part of a high volume manufacturing process, e.g., wherein a flexible polymer film or similar substrate, optionally in the form of a roll good, is processed in a continuous or semi-continuous fashion at a series of stations on a film line. Such a roll good may be quite large, e.g., with a length or down-web dimension, when unrolled, of at least 1, 10, or 100 meters, and a width or cross-web dimension of at least 0.1, 0.5, or 1 meter. Further details regarding the use of buffing devices and dry compositions to produce carbon nanolayers can be found in U.S. Pat. No. 6,511,701 (Divigalpitiya et al.) and Patent Application Publication US 2010/0055569 (Divigalpitiya et al.).

Figure 2:
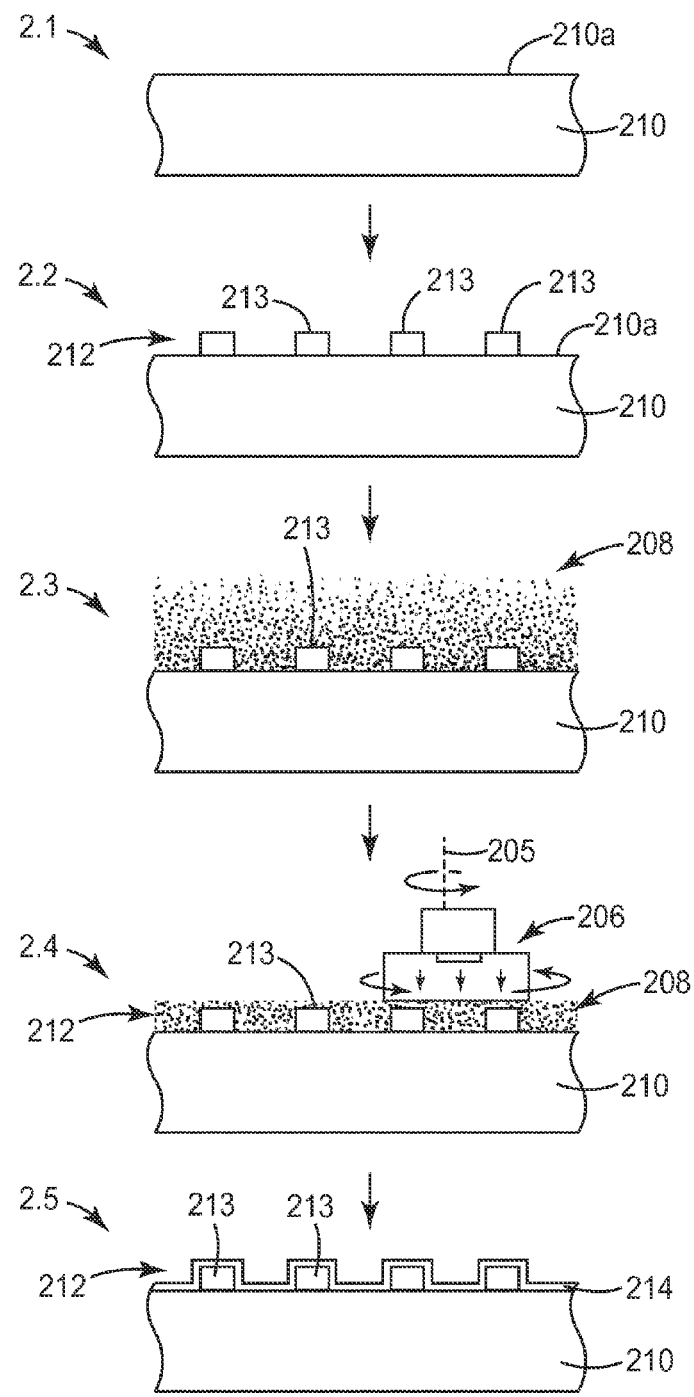
FIG. 2 is a collection of schematic side- or cross-sectional views depicting a process in which a very thin electrically conductive grid is applied to a substrate, and a buff-coating process is then used to form a carbon nanolayer on the patterned substrate without substantially damaging the grid's physical integrity, to provide an electrically conductive article.

Turning now to FIG. 2, we see there a collection of schematic diagrams similar to those of FIG. 1, but where now a very thin electrically conductive grid is applied to a substrate before the buff-coating process. Despite the delicate nature of the very thin grid, and the use of a high speed rotary buffing device, we have found that the buff-coating process can successfully form a carbon nanolayer on all portions of the patterned substrate without substantially damaging the grid's physical integrity.

In step 2.1, a substrate 210 is provided that has a major surface 210a. The substrate 210 may be the same as or similar to substrate 110 described above.

In step 2.2, a thin electrically conductive grid 212 is formed on the surface 210a. The grid 212 may be formed using any known patterning processes, including printing, masking, etching, ablating, photolithography, soft lithography, microcontact printing, electroplating, and electroless plating, for example. In one approach, a thin, continuous, unpatterned layer of metal or other electrically conductive material can be deposited on the substrate 210, followed by etching, ablating, or otherwise removing most of the conductive layer so that the remaining portions of the conductive layer form thin conductive segments 213 that interconnect with each other to form the finished grid 212. Alternatively, the segments 213 may be formed via a printing process or other patterned deposition process without ablating, etching, or removing conductive material. Preferred materials for use in the electrically conductive grid 212 are materials having a conductivity of at least $10^5$ or at least $10^4$ Siemens/meter. Exemplary materials are or include metals such as aluminum, silver, gold, copper, nickel, titanium, chromium, indium, and any alloys thereof. Other useful materials also include electrically conductive polymers such as polythiophenes, polyanilines, polypyrroles, polyphenylene sulfides, polyacetylenes, and polyethylene dioxythiophenes. The material used in the grid 212 is preferably a material other than ITO. The thickness of the grid 212 and segments 213 thereof is preferably no more than 1 micrometer, for optimal mechanical properties such as flexibility. The thickness may in some cases be tailored to be less than 1, or 0.5, or 0.25, or even 0.1 micrometer.

The grid segments 213 themselves are typically substantially opaque, although they can be made thin enough so that they become partially transmissive to visible light. The grid 212 as a whole, however, is highly transmissive for light incident normally on the grid, as well as for light incident over a range of oblique angles, due to the large amount of open space in which no conductive material is present. We can quantify this using a parameter called the "percent open area". The percent open area is the fraction or percentage of a selected spatial region in which the grid is located, when viewed in plan view, that is not occupied by the constituent segments or parts of the grid. The selected spatial region should be large compared to a characteristic dimension of the grid, to ensure that small changes in the position or size of the selected region result in only minimal changes to the percent open area calculation, if any. The grid may have a percent open area of at least 90%, for example. All aspects of the grid design, such as the percent open area, thickness, pattern design, and the pitch or other characteristic dimension of the pattern, may be optimized to balance optical transmission with electrical conductivity. In some cases there may be two or more distinct conductive grids that are disposed on the same substrate but patterned in such a way that they avoid contacting each other, and are electrically isolated from each other.

The substrate 210 with the finished conductive grid 212 affixed atop the surface 210a can be considered to be an intermediate article. In step 2.3, a dry composition 208 is applied to this intermediate article so that it contacts the grid 212 and the portions of surface 210a that are exposed by the absence of any grid segment 213. The dry composition 208 can be the same as or similar to the dry composition 108 of FIG. 1. The composition 208 preferably comprises exfoliatable carbon particles. The discussion above relating to the application of dry composition 108 to the substrate 110 is equally applicable to the application of dry composition 208 to the intermediate article depicted in step 2.2 of FIG. 2. Thus, the dry composition 208 can be applied to the intermediate article by direct application to the intermediate article, by application to the applicator pad (discussed below in step 2.4), or by a combination of both.

In step 2.4, a mechanical buffing device 206 is used to lightly buff the dry composition 208 against the intermediate article produced in step 2.2, i.e., against the grid 212 and exposed portions of the surface 210a. The buffing device 206 and its operation may be the same as or similar to the buffing device 106 of FIG. 1. Thus, an applicator pad of the device 206 may move in a rapid orbital motion about a rotational axis 205 and press lightly against the intermediate article, e.g., with a pressure normal to the surface 210a greater than zero and less than about 30 g/cm².

We have found that the rapidly moving applicator pad can again produce a high quality thin carbon nanolayer 214, shown schematically in the finished article of step 2.5. In the case of FIG. 2, the nanolayer is produced on the intermediate article with its thin, delicate conductive grid 212, rather than on a simple flat substrate as in FIG. 1. In this regard, we found it surprising that the buffing operation of step 2.4 could be carried out without substantially damaging the conductive grid. Thus, the grid, whose thickness is roughly on the order of a wavelength of light, has a physical integrity that is substantially maintained throughout the buff coating process. The buff coating process typically forms the carbon nanolayer 214 on all exposed surfaces of the intermediate article, such that the nanolayer substantially conforms to the top and side surfaces of the grid segments 213 and the exposed portions of surface 210a. Formation of the carbon nanolayer on all exposed surfaces of the intermediate article is, in some respects, consistent with the variable topography of typical buffing device applicator pads, which pads may contain bristles, fabric, and/or other surface structures that are large compared to the thickness of the conductive grid 212. One may expect such structures to carry particles during the buffing operation to all exposed surfaces of the intermediate article. One may, however, also expect that the rapid and repeated motion of such structures would readily abrade and damage the very thin conductive grid 212. We have found that this is not the case.

Similar to nanolayer 114 in FIG. 1, the nanolayer 214 has a thickness that can be controlled by controlling the buffing time. Generally, the thickness of the coating increases linearly with buffing time after a certain rapid initial increase. Thus, the longer the buffing operation, the thicker the coating. The coating thickness of the nanolayer 214 can also be controlled by controlling the amount of dry powder composition 208 used during the buffing operation. Other aspects of nanolayer 214 are also the same as or similar to nanolayer 114. For example, in exemplary embodiments the nanolayer 214 is tailored to be no more than 50, 20, 15, 10, or 5 nanometers thick, and at least 0.5 nanometers thick, such that its transmission over visible wavelengths is reasonably high, and its sheet resistance is reasonably low. Like the sheet resistance of nanolayer 114, the sheet resistance of the nanolayer 214, when considered by itself, can range widely. However, in the case of the finished transparent conductive article depicted in step 2.5, the nanolayer 214 is disposed on the substrate 210 together with the conductive grid 212. The nanolayer 214 moreover makes physical and electrical contact with the grid elements 213, and extends between such grid elements. In many cases, the grid 212 has a substantially higher conductivity, and a substantially lower sheet resistance, than the nanolayer 214 by itself. Hence, the combination of the grid 212 and nanolayer 214, in the finished article of step 2.5, in many cases has an effective conductivity and sheet resistance that are close to those of the grid 212 alone.

Similar to FIG. 1, one, some, or all of steps 2.1 through 2.5 may be carried out using batch processes on a substrate of limited size, or they may be carried out as part of a high volume manufacturing process, e.g., wherein a flexible polymer film or similar substrate, optionally in the form of a roll good, is processed in a continuous or semi-continuous fashion at a series of stations on a film line. Such a roll good may be quite large, e.g., with a length or down-web dimension, when unrolled, of at least 1, 10, or 100 meters, and a width or cross-web dimension of at least 0.1, 0.5, or 1 meter.

Figure 3A:
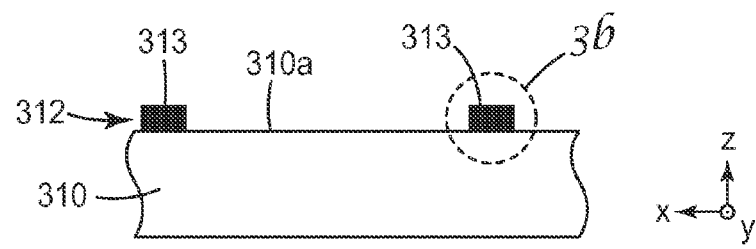
FIGS. 3a through 3c are schematic side- or cross-sectional views showing portions of an electrically conductive article such as that made by the process of FIG. 2.
Figure 3B:
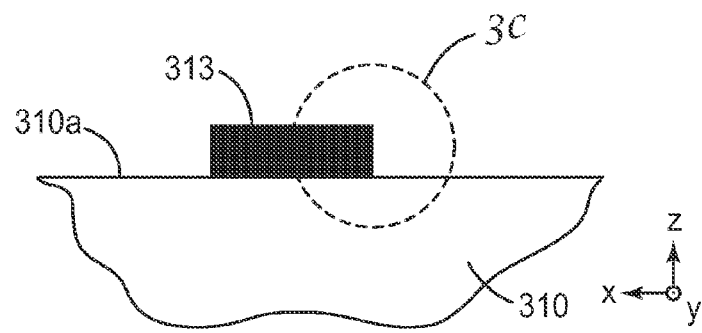
Figure 3C:
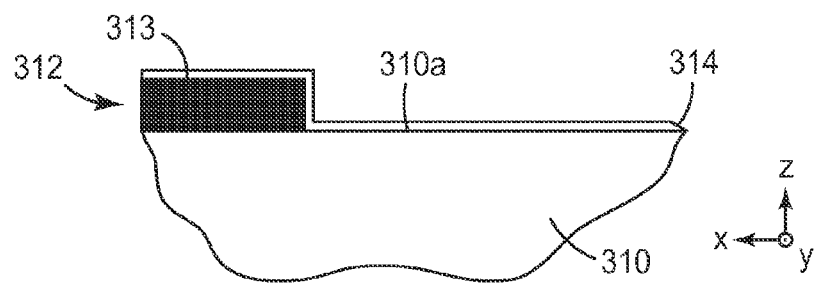

FIGS. 3a through 3c are schematic views showing portions of an electrically conductive transparent article such as that made by the process of FIG. 2. FIGS. 3a-3c show a portion of a conductive transparent article having a substrate 310, a conductive grid 312 disposed on the substrate 310, and a carbon nanolayer 314 disposed on both the substrate 310 and the conductive grid 312. The article and its constituent components may be the same as or similar to the finished transparent conductive article discussed in connection with FIG. 2, and its corresponding constituent components. For reference purposes, FIGS. 3a-3c include a Cartesian x-y-z coordinate system, with the x-y plane oriented generally parallel to the substrate 310. The substrate 310 may be the same as or similar to substrate 210 of FIG. 2. The conductive grid 312, with its interconnected grid elements 313, may be the same as or similar to the grid 212 and grid elements 213 respectively of FIG. 2. The carbon nanolayer 314 may be the same as or similar to the carbon nanolayer 214.

We have found that the nanolayer provided by the buffing process coats substantially all portions of the intermediate article that are contacted by the dry composition. Thus, in FIG. 3c, the nanolayer 314 is depicted as residing not only on the exposed portion of major surface 310a and the top of grid element 313, but also on the side surface of the grid element 313. By coating substantially all exposed surfaces of the grid elements, the carbon nanolayer helps protect the grid elements, and the conductive grid itself, from oxidation or corrosion.

Furthermore, despite the fact that the carbon nanolayer has, if considered by itself divorced from the conductive grid, a sheet resistance that is typically several orders of magnitude higher than that of the conductive grid considered by itself, the carbon nanolayer nevertheless can provide a significant electric field spreading effect that is discussed further below. We have also found that the carbon nanolayer and grid combination, when used on a flexible substrate, are very robust with respect to repeated flexing of the article, particularly in comparison to ITO. This stability to flexing is discussed further below.

Plan views of exemplary conductive grid designs that may be used in the disclosed embodiments are shown in FIGS. 4a through 4e. These grids are each depicted as extending parallel to the x-y plane, consistent with the coordinate system orientation in FIGS. 3a-3c. The reader will understand, however, that this is done for convenience of description. The disclosed transparent conductive articles need not be precisely planar in configuration (although they may be if desired), but can be curved, rounded, bent, or of any other non-planar shape as desired.

Figure 4A:
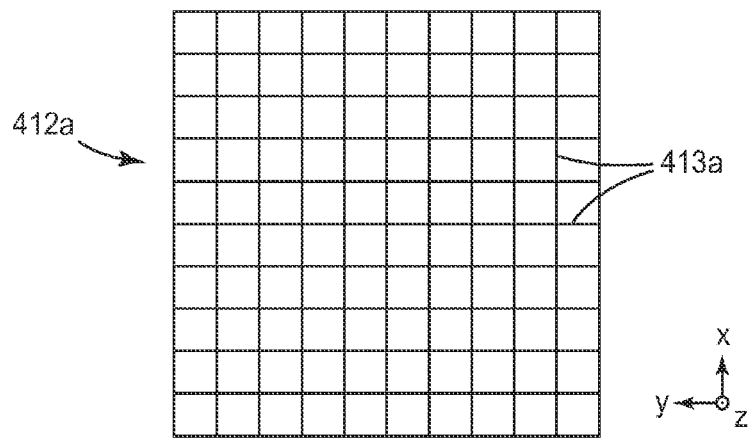
FIGS. 4a through 4e are plan views of exemplary grid designs that may be used in the disclosed embodiments.
Figure 4B:
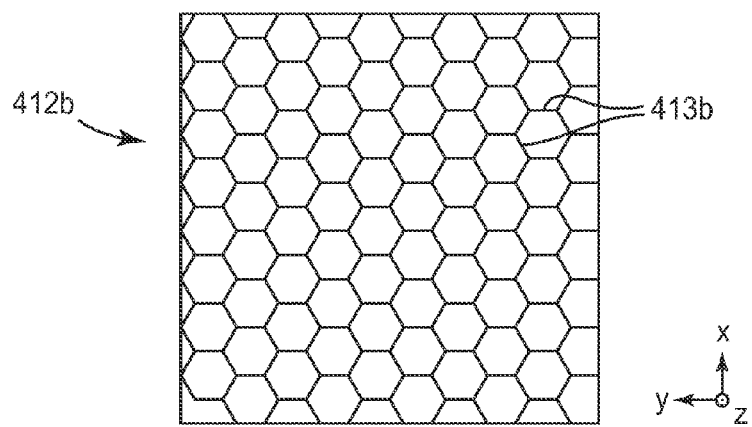
Figure 4C:
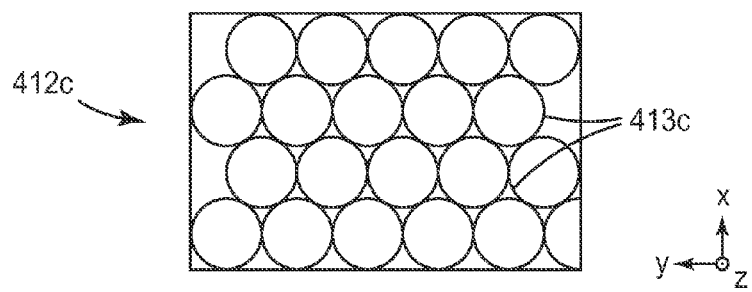
Figure 4D:
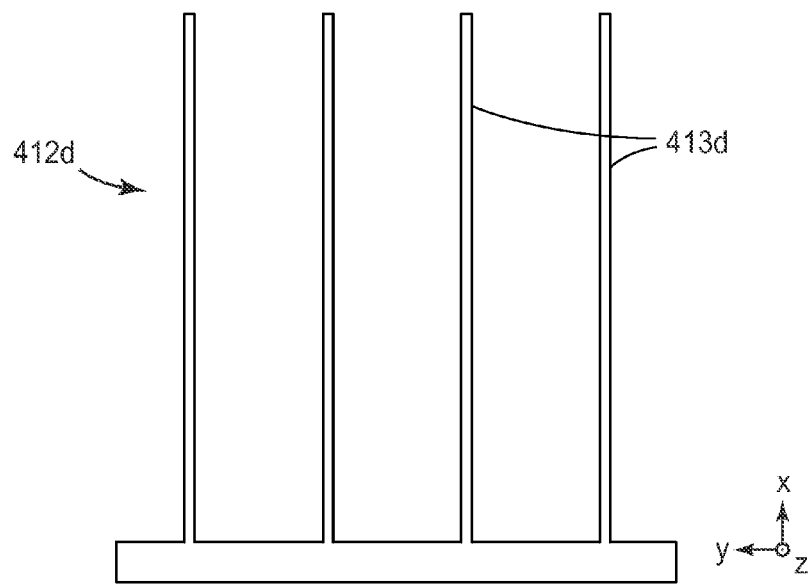
Figure 4E:
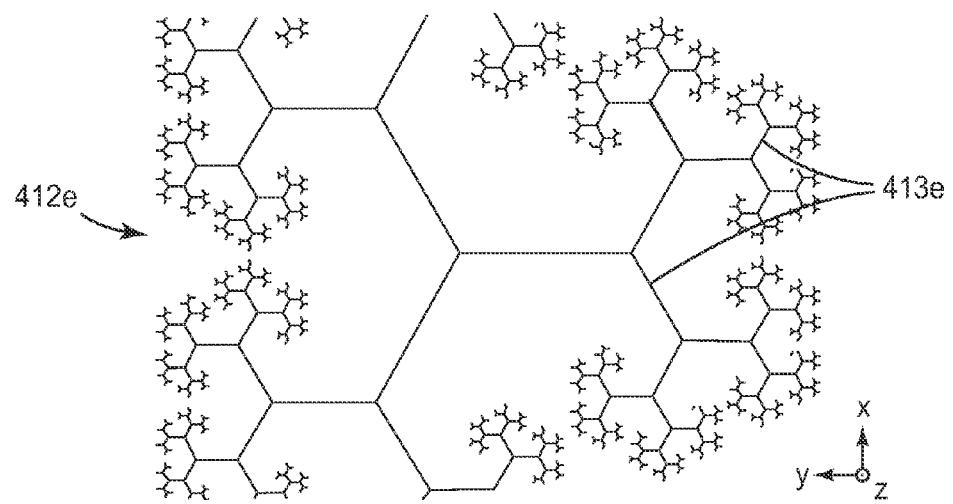

In FIG. 4a, conductive grid 412a is composed of grid elements 413a arranged to form a regular repeating array of squares. In FIG. 4b, conductive grid 412b is composed of grid elements 413b arranged to form a regular repeating array of hexagons. In FIG. 4c, conductive grid 412c is composed of grid elements 413c arranged to form a substantially regular repeating array of circles. In FIG. 4d, conductive grid 412d is composed of grid elements 413d arranged to form a set of regularly spaced parallel lines. In FIG. 4e, conductive grid 412e is composed of grid elements 413e arranged to form a fractal pattern. At least in the case of grids 412a, 412b, and 412c, the grid elements form a unit cell shape that is repeated in both the x- and y-directions. In grid 412d, the grid elements form a unit cell shape that is repeated in only the y-direction. In grid 412e, the grid elements form structures of various sizes and shapes that do not repeat uniformly and consistently along either the x-axis or the y-axis. The reader will understand that the depicted patterns are for exemplary purposes and are not intended to be limiting. Numerous variations of the depicted patterns can be made. For example, the aspect ratios of grids 412a, 412b, and 412c can be changed to provide regular repeating arrays of rectangles, elongated hexagons, and ellipses, respectively. The grid need not have a regular repeating pattern, but may have an irregular pattern, including a random or quasi-random pattern. The grid may be made up of grid elements that are all of the same length and line width, e.g. as in FIGS. 4a, 4b, 4c, or it may be made up of grid elements of differing length and line width, e.g. as in FIG. 4e.

Figure 5:
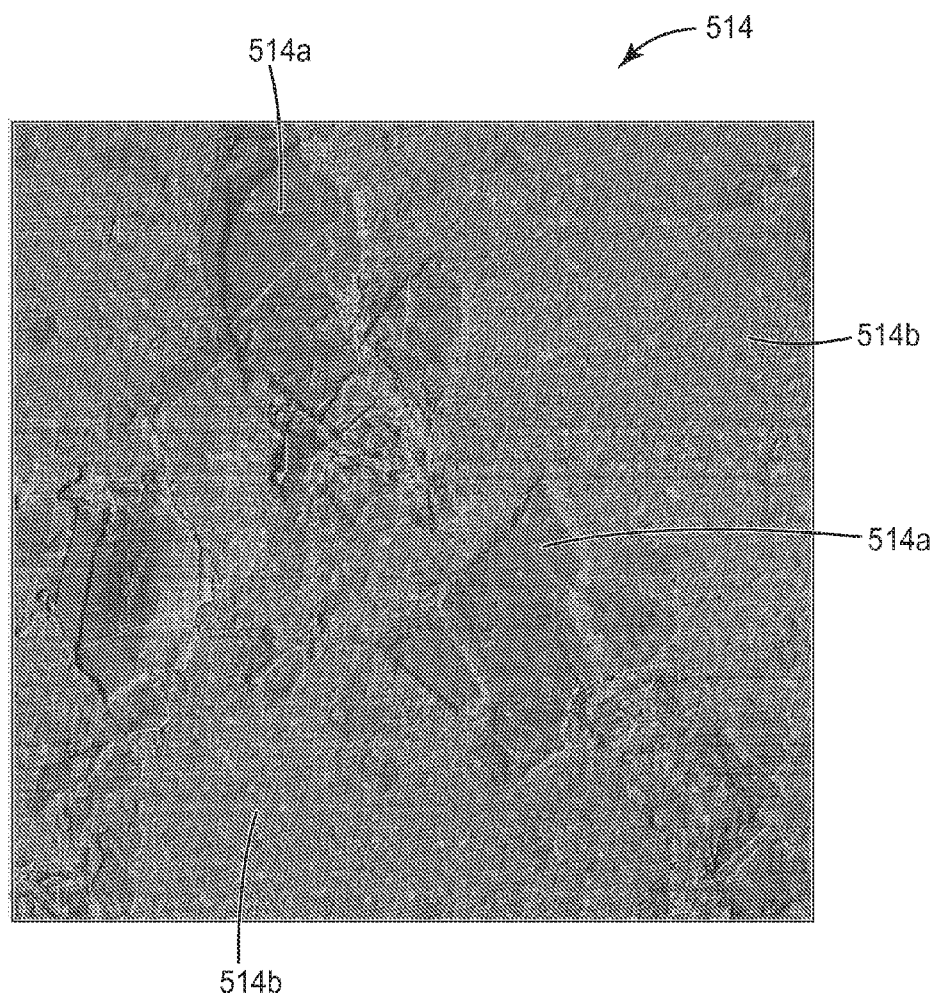
FIG. 5 is a scanning tunneling microscope (STM) image of a carbon nanolayer made by the buffing processes depicted in FIG. 1 or 2, the image revealing a morphology in which graphite platelets are embedded in nano-crystalline carbon.

We shift our attention now from the conductive grid to the carbon nanolayer. The buff coating process depicted and described in connection with each of FIGS. 1 and 2 can be used to produce high quality, low cost nanolayers of carbon that are uniform in thickness, of high transparency (provided the thickness of the nanolayer is not too large), and of adequate sheet resistance. Interestingly, the carbon nanolayers produced by the buff coating process have a characteristic morphology that is distinct from single layer graphene on the one hand, and from nano-crystalline carbon on the other hand. FIG. 5 is a scanning tunneling microscope (STM) image 514 of a typical carbon nanolayer made by the buff coating process. The scale of the image is such that the length of each side of the square-shaped image is 6 micrometers. The image reveals a morphology in which graphite platelets 514a are embedded in nano-crystalline carbon 514b.

Note that the process of FIG. 2 produces an article in which the conductive grid is disposed between the substrate and the carbon nanolayer, as seen in FIG. 3c. One benefit of this configuration, already mentioned above, is that the carbon nanolayer helps to protect the grid from oxidation or corrosion.

Figure 6:
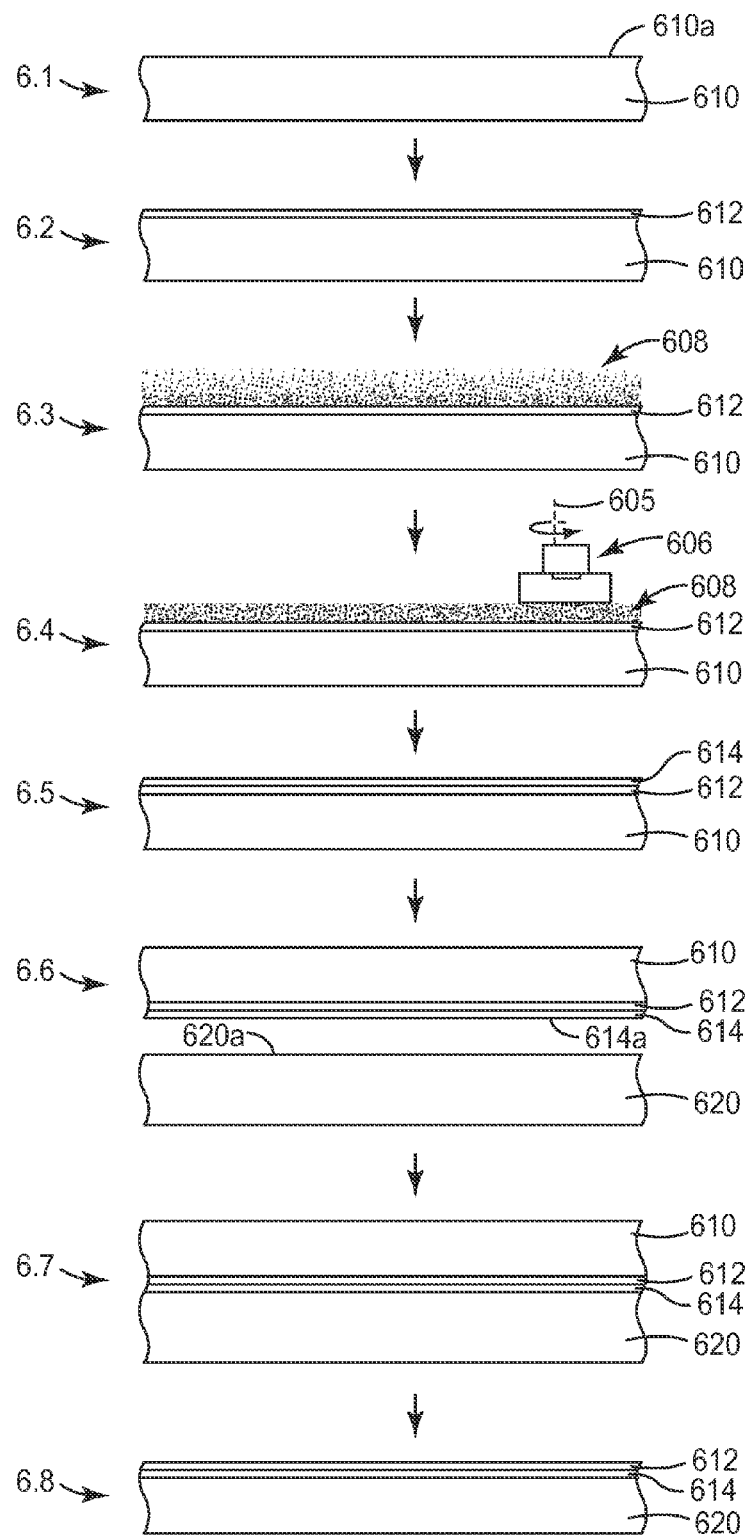
FIG. 6 is a collection of schematic side- or cross-sectional views depicting a process in which a carbon nanolayer is formed with a buff-coating process on a first electrically conductive grid-coated substrate, the carbon nanolayer and electrically conductive grid then being transferred to a second substrate to provide an alternative electrically conductive article.

An alternative configuration is one in which the carbon nanolayer is disposed between the substrate and the grid. One way of fabricating a transparent conductive article of this alternative configuration is to follow the steps depicted in FIG. 1, and then simply form a suitable conductive grid as disclosed elsewhere herein atop the exposed surface of layer 114 (see step 1.4 in FIG. 1) by printing, masking, etching, etc. FIG. 6 depicts a different way of fabricating a transparent conductive article of the alternative configuration. In brief, the carbon nanolayer and conductive grid are arranged on a first substrate in the conventional manner of FIG. 3c, and are subsequently transferred to a second substrate, the transferring operation having the effect of flipping the order of the carbon nanolayer and conductive grid on the second substrate.

In step 6.1 of FIG. 6, a substrate 610 is provided that has a major surface 610a. The substrate 610 may be the same as or similar to substrate 210 described above. However, in the case of FIG. 6, the substrate 610 need not be transparent, and furthermore may be provided with a layer, film, or other structure at or near the surface 610a that will permit detachment of the subsequently formed conductive grid and carbon nanolayer. Such a detachment structure may be or comprise, for example, silicone, urethane, or a fluorinated low energy surface layer.

In step 6.2, a thin conductive grid 612 is formed on the surface 610a. The grid 612 may be formed using any known patterning processes, and may be the same as or similar to the grid 212 discussed above. The grid 612 is shown only schematically in FIG. 6, i.e., as a layer of uniform thickness, but the reader will understand that the grid 612 actually includes distinct, sparsely arranged grid segments separated by large open areas as shown for example in FIGS. 2, 3, and 4. The substrate 610 with the finished grid 612 affixed atop the surface 610a can be considered to be an intermediate article.

In step 6.3, a dry composition 608 is applied to this intermediate article so that it contacts the conductive grid 612 and the portions of surface 610a that are exposed by the absence of any grid segment. The dry composition 608 can be the same as or similar to the dry composition 208 of FIG. 2. The composition 608 preferably comprises exfoliatable carbon particles.

In step 6.4, a mechanical buffing device 606 is used to lightly buff the dry composition 608 against the intermediate article, i.e., against the grid 612 and exposed portions of the surface 610a. The buffing device 606 and its operation may be the same as or similar to the buffing device 206 of FIG. 2. Thus, an applicator pad of the device 606 may move in a rapid orbital motion about a rotational axis 605 and press lightly against the intermediate article, e.g., with a pressure normal to the surface 610a greater than zero and less than about 30 g/cm$^2$.

Just as in FIGS. 1 and 2, the rapidly moving applicator pad again produces a high quality thin carbon nanolayer 614, shown schematically in the article of step 6.5, which article is referred to here as a provisional article. The nanolayer 614, which may be the same as or similar to nanolayer 214 discussed above, is produced on the intermediate article (see step 6.2) using the buffing operation of step 6.4 without substantially damaging the conductive grid 612.

In step 6.6, a second substrate 620 is introduced, the substrate having a major surface 620a, and the provisional article of step 6.5 is oriented such that the carbon nanolayer 614 and the conductive grid 612 are disposed between the first substrate 610 and the second substrate 620. The second substrate 620 may be the same as or similar to substrate 210 described above, each of which is preferably transparent. However, the substrate 620 may be provided with a layer, film, or other structure at or near the surface 620a that will facilitate attachment of the conductive grid 612 and carbon nanolayer 614. Such an attachment structure may be or comprise a layer of adhesive, for example.

In step 6.7, the intermediate article is bonded to the second substrate 620 by bringing the exposed surface 614a of the carbon nanolayer 614 into contact with the major surface 620a of substrate 620.

In step 6.8, the first substrate 610 is detached from the remainder of the construction. This may be carried out by, for example, mechanically peeling off the structure. Removal of the substrate 610 yields the finished transparent conductive article depicted in step 6.8, in which the carbon nanolayer 614 is disposed on the substrate 620, the conductive grid 612 is also disposed on the substrate 620, and the carbon nanolayer is disposed between the substrate and the grid.

Similar to FIGS. 1 and 2, one, some, or all of steps 6.1 through 6.8 may be carried out using batch processes on a substrate of limited size, or they may be carried out as part of a high volume manufacturing process, e.g., wherein a flexible polymer film or similar substrate, optionally in the form of a roll good, is processed in a continuous or semi-continuous fashion at a series of stations on a film line. Such a roll good may be quite large, e.g., with a length or down-web dimension, when unrolled, of at least 1, 10, or 100 meters, and a width or cross-web dimension of at least 0.1, 0.5, or 1 meter.

As mentioned above, despite the fact that the carbon nanolayer has, if considered by itself divorced from the conductive grid, a sheet resistance that is typically several orders of magnitude higher than that of the grid considered by itself, the carbon nanolayer nevertheless can provide a significant electric field spreading effect. This field spreading effect will now be discussed in connection with an optical device that requires an extended area transparent electrode. One such device is a liquid crystal switching device. In a liquid crystal switching device, a liquid crystal material is disposed between a front and back electrode, the electrodes having extended areas that are substantially aligned with each other, the electrodes also being substantially transparent so that light can pass through the electrodes and through the liquid crystal material when the device is in an "on" state. In the "off" state, the liquid crystal material is strongly scattering, such that an observer perceives virtually no transmitted light through the extended area of the electrode. The "on" state may correspond to a suitable electric field applied to the liquid crystal material, whereas the "off" state may correspond to no electric field applied to the liquid crystal material. The liquid crystal switching device may have only one switchable area, i.e., the one associated with the front and back electrode pair, or the device may have a multitude of substantially similar switchable areas, each one having its own front and back extended area transparent electrodes electrically isolated from other transparent electrodes, the switchable areas arranged in rows and columns to form a pixelated display, for example.

Figure 7:
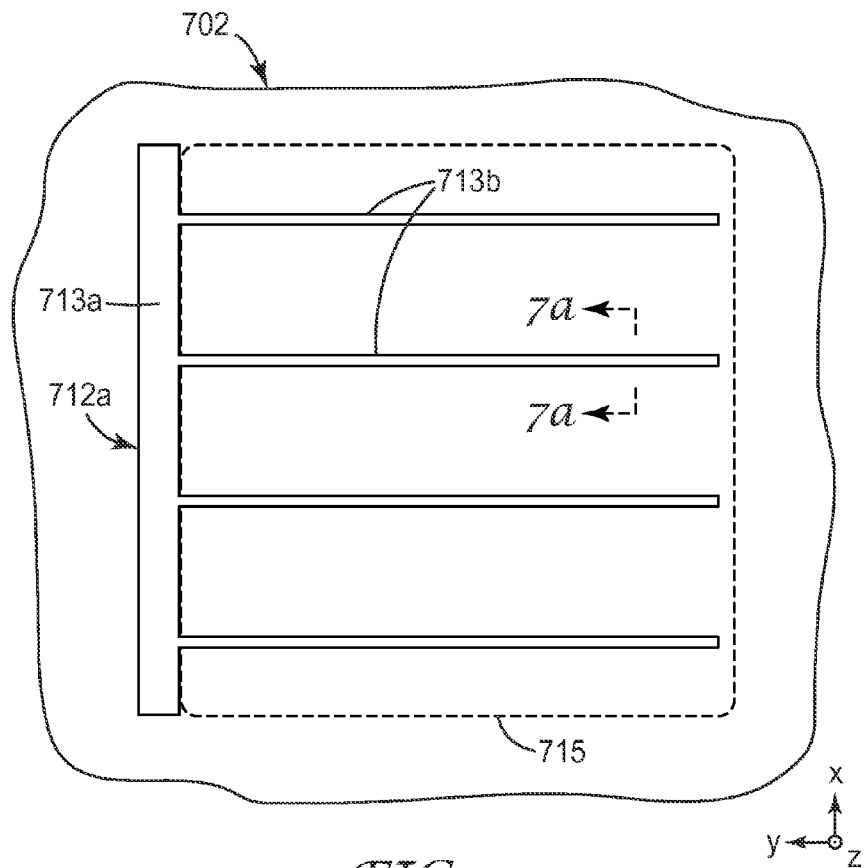
FIG. 7 is a schematic top or plan view of a liquid crystal switching device that includes an electrically conductive article as disclosed herein.

FIG. 7 is a schematic top or plan view of such a liquid crystal switching device. The device includes a transparent conductive article 702, which extends generally parallel to the x-y plane. The article 702 provides a front electrode over an extended area 715 using a conductive grid 712a in combination with a carbon nanolayer, as discussed in the embodiments above. The grid 712a may be the same as or similar to grid 212 discussed in connection with FIG. 2 or grid 312 discussed in connection with FIG. 3. The grid 712a includes substantially linear grid elements 713b which connect electrically to each other via another grid element 713a. The reader will understand that the comb-shaped design of grid 712a is only one of many possibilities, and it may be modified or replaced with any other suitable conductive grid pattern as discussed elsewhere herein.

Figure 7A:
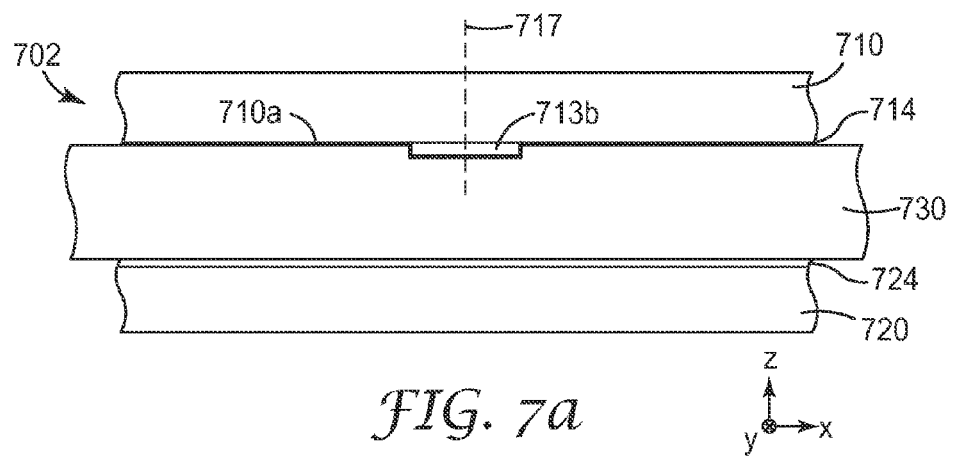

FIG. 7a reveals schematically the layered structure of the switching device of FIG. 7 along lines 7a-7a. In this view, one can see the transparent conductive article 702, with its substrate 710, grid element 713b of conductive grid 712a, and carbon nanolayer 714. These components may be the same as or similar to corresponding substrates, conductive grids, and carbon nanolayers discussed in the embodiments above. The carbon nanolayer 714 extends in the x-y plane to fill the extended area 715. Opposed to the article 702, which we may refer to as a front transparent conductive article, is a back or rear transparent conductive article that includes a substrate 720 and a transparent conductor 724. For purposes of the present discussion, we will assume that the transparent conductor 724 is a layer of ITO that, like the carbon nanolayer 714, extends in the x-y plane to fill the extended area 715. The conductor 724 is assumed to have a high conductivity and low sheet resistance. The substrate 720 may be the same as or similar to substrate 710, or any other substrate discussed herein.

Sandwiched between the front transparent conductive article 702 and the back transparent conductive article is a polymer-dispersed liquid crystal (PDLC) layer 730. The PDLC layer 730, which may be of any known construction, extends in the x-y plane to fill the extended area 715, and provides the active liquid crystal switching behavior discussed above. That is, when a suitable electric field is applied to any given portion of the PDLC layer 730, that portion of the PDLC layer becomes clear with little or no light scattering. On the other hand, a portion of the PDLC layer that has no applied electric field is highly scattering and exhibits high haze.

A switchable power supply (not shown) connects to the conductive grid 712a of the front transparent conductive article 702 and to the transparent ITO conductor 724 of the back transparent conductive article. If the carbon nanolayer 714 is sufficiently conductive, then, when the power supply applies a suitable voltage across the grid 712a and the ITO conductor 724, the conductive grid/carbon nanolayer combination acts like a single large area front electrode opposite the large area back electrode formed by the ITO conductor 724, and electric field lines are established that are substantially spatially uniform over the (x,y) coordinates defined by the extended area 715. Such a situation is depicted in FIG. 7c. FIG. 7c is substantially similar to FIG. 7a, with like reference numerals designating like elements. The carbon nanolayer is labeled 714" in FIG. 7c to represent the carbon nanolayer 714 for the case where the nanolayer has a sufficiently high conductivity and sufficiently low sheet resistance. In like fashion, the front transparent conductive article is labeled 702" to represent the front transparent conductive article 702 for the case where the nanolayer 714 is the highly conductive nanolayer 714". Idealized electric field lines 735" are shown in FIG. 7c to represent a substantially spatially uniform electric field over the extended area 715. A reference axis or plane 717, centered on the depicted grid element 713b, is provided in FIGS. 7a, 7b, and 7c for discussion purposes so that positions or displacements along the x-axis can be unambiguously referred to.

Figure 7B:
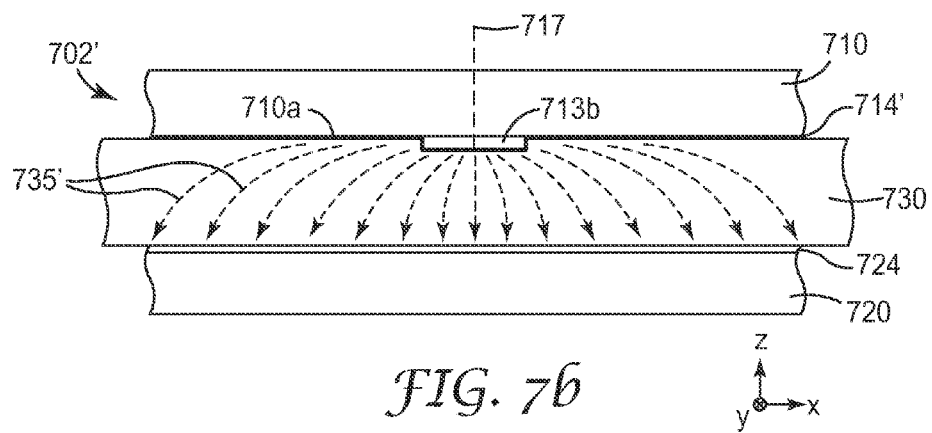
FIG. 7b is a schematic side- or cross-sectional view similar to FIG. 7a but where idealized electric field lines have been drawn between a segment or part of the electrically conductive grid and a second electrode, and where the carbon nanolayer is assumed to have a low conductivity and high sheet resistance.
Figure 7C:
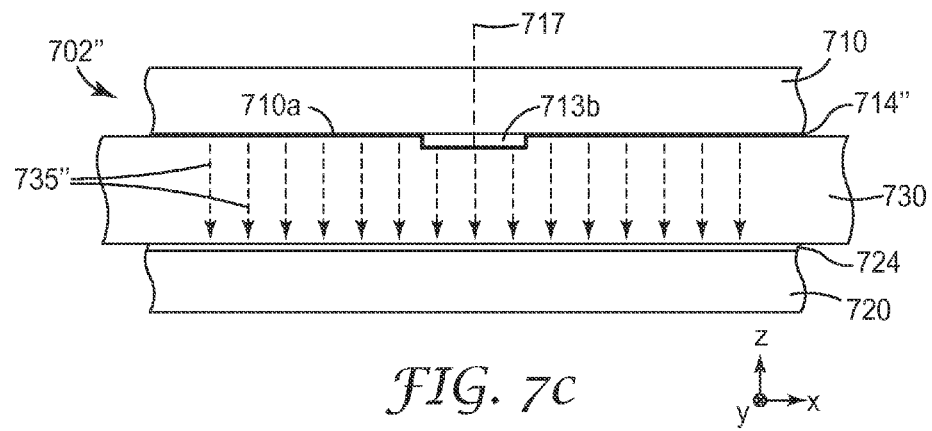
FIG. 7c is a schematic side- or cross-sectional view similar to FIG. 7b, but wherein the carbon nanolayer is assumed to have a high conductivity and low sheet resistance.

FIG. 7b is substantially similar to FIGS. 7a and 7c, with like reference numerals designating like elements, but where the carbon nanolayer is labeled 714' to represent the carbon nanolayer 714 for the case where the nanolayer has a poor electrical conductivity and unacceptably high sheet resistance. In like fashion, the front transparent conductive article is labeled 702' in FIG. 7b to represent the front transparent conductive article 702 for the case where the nanolayer 714 is the poorly conductive nanolayer 714'. Idealized electric field lines 735' are shown in FIG. 7b to represent the spatially non-uniform electric field that is set up over the extended area 715 when the power supply applies the given voltage across the conductive grid 712a and the ITO conductor 724.

The field spreading effect of the carbon nanolayer can be readily appreciated by comparing the electric field lines of FIG. 7b with those of FIG. 7c. The only design difference between the embodiments depicted in those figures is the assumed conductivity or sheet resistance of the carbon nanolayer. By providing the carbon nanolayer with a sufficiently high conductivity (and sufficiently low sheet resistance), electric field lines that would otherwise be substantially non-uniform along the x-direction can be made to be substantially uniform. The spatial uniformity or non-uniformity of the electric field has a direct effect on the performance of the liquid crystal switching device. In the case of FIG. 7c, the PDLC layer 730 is exposed to a suitably strong electric field 735" at substantially all (x,y) positions within the extended area 715; hence, the device transmits light substantially uniformly over all such positions, ignoring the small area occupied by the grid elements 713b. In contrast, the PDLC layer 730 in the case of FIG. 7b is exposed to a suitably strong electric field 735' only at (x,y) positions that are close to the grid elements 713b. In the large spaces of the extended area 715 between the grid elements, the electric field strength is inadequate, and the PDLC layer is highly scattering rather than clear. Consequently, the spatially averaged haze over the extended area 715 for the "on" state of the switching device will be very high (i.e., poor) in the case of FIG. 7b, but will be low in the case of FIG. 7c.

Figure 7D:
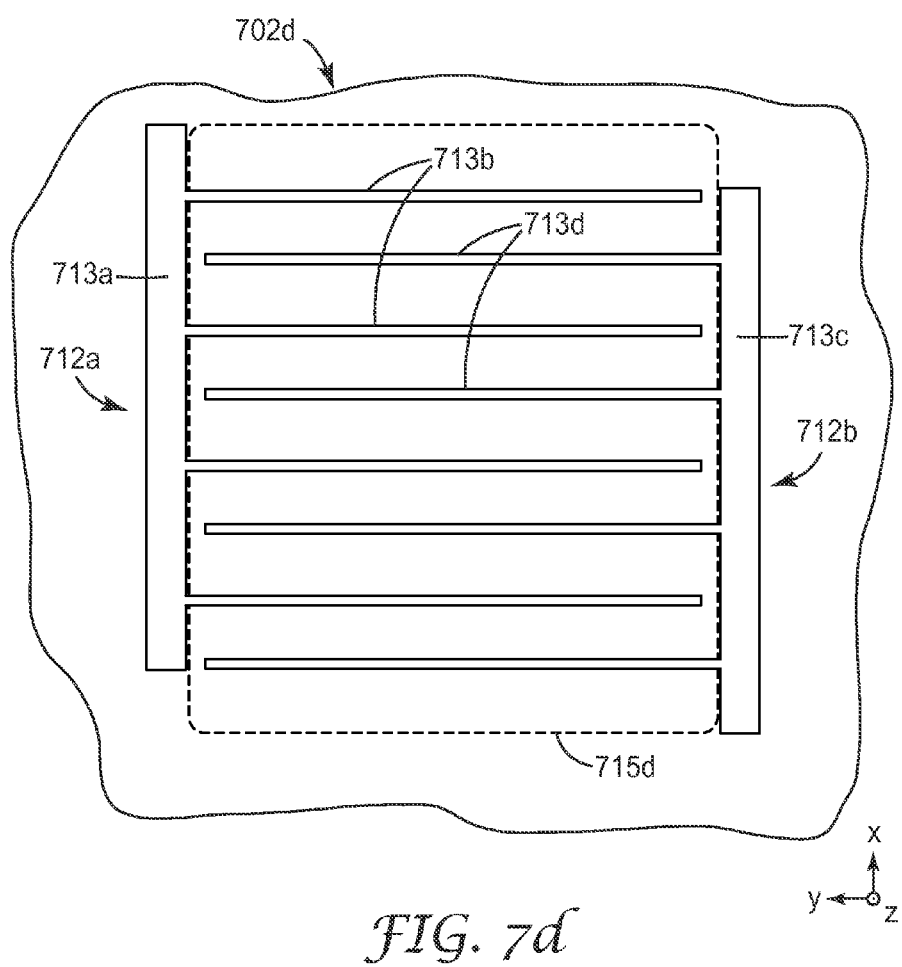
FIG. 7d is a schematic top or plan view of a liquid crystal switching device similar to that of FIG. 7, but where two distinct electrically conductive grids are provided.

FIG. 7d is a schematic top or plan view of a liquid crystal switching device similar to that of FIG. 7, but where two distinct electrically grids are provided. In one embodiment, the front transparent article 702d is the same as front transparent article 702 of FIG. 7, and the second conductive grid 712b, with constituent grid elements 713c, 713d and in combination with a second carbon nanolayer (not shown), replaces the ITO layer 724 on the back substrate 720. Such an embodiment still defines an extended area 715d for switchable light transmission, and the area 715d may be substantially the same as or similar to the extended area 715 of FIG. 7. In one variation of this embodiment, the conductive grid 712b may be shifted along the x-axis such that each of the elongated grid elements 713d is, in plan view, disposed directly behind a corresponding grid element 713b of the conductive grid 712a. Such a design can be used to minimize blocking of normally incident light by the grid elements of the device.

In another interpretation of FIG. 7d, the ITO layer 724 and back substrate 720 can remain the same as in FIG. 7a, and the second conductive grid 712b can be applied to the same major surface of the upper substrate 710 as conductive grid 713b. In that case, the grids 712a, 712b may be electrically isolated from each other, to the extent that no electrically conductive path connects grid elements 713d to grid elements 713b. However, if the carbon nanolayer 714 again extends over the entire extended area 715 and contacts both the grid elements 713b and the grid elements 713d, then such carbon nanolayer will have the effect of coupling the electric field of elements 713b, 713d.

Figure 8A:
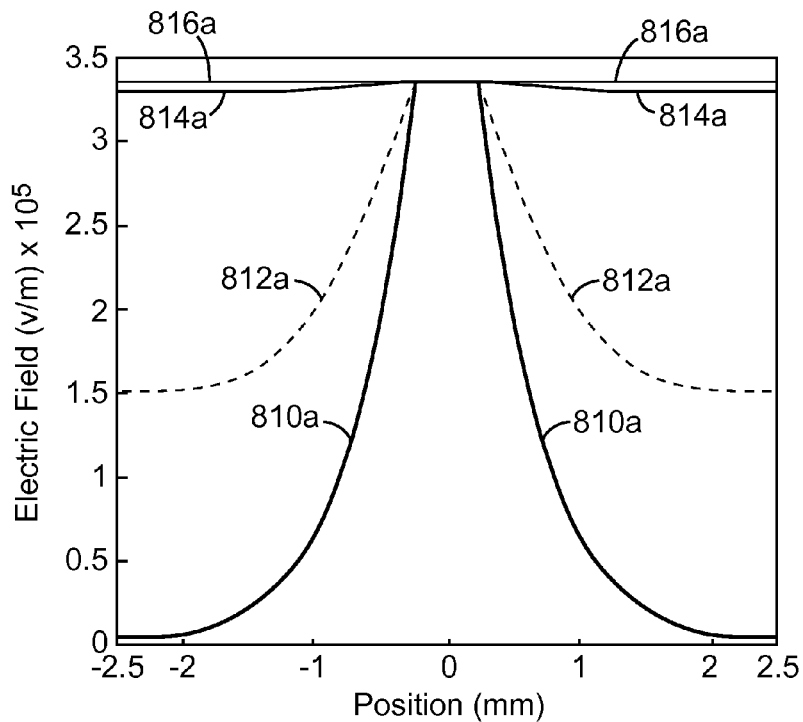
FIGS. 8a through 8c are graphs of calculated electric field strength versus position for the embodiment of FIGS. 7 and 7a, FIG. 8a assuming a modulation frequency of 10 Hz, FIG. 8b assuming a modulation frequency of 100 Hz, and FIG. 8c assuming a modulation frequency of 1000 Hz.
Figure 8B:
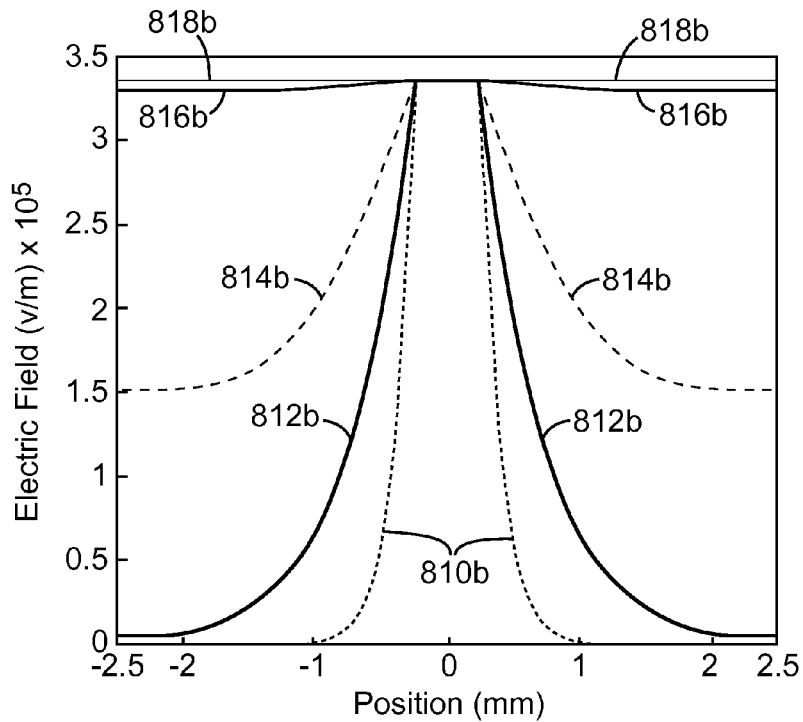
Figure 8C:
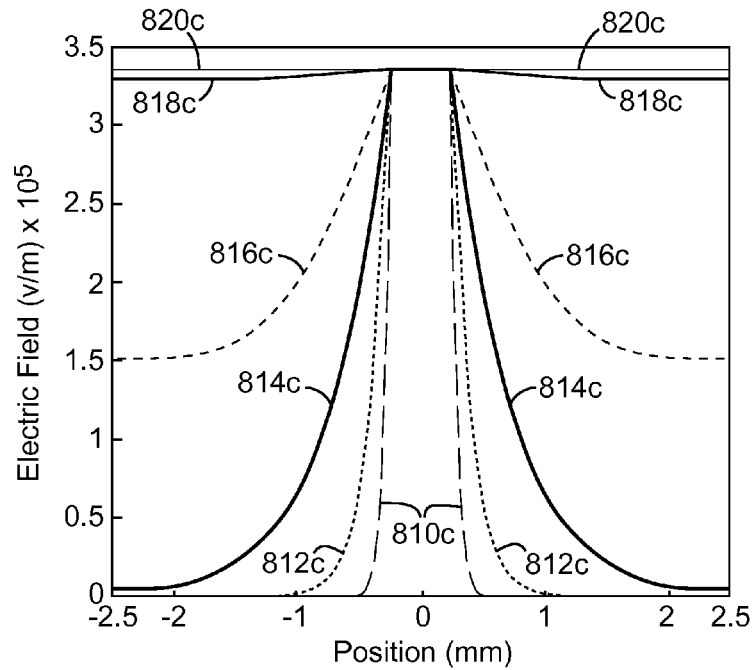

FIGS. 8a through 8c are graphs of calculated (modeled) electric field strength versus position for the embodiment of FIGS. 7 and 7a. These graphs provide guidance in answering the question of how conductive the carbon nanolayer needs to be in order to function as an adequate electric field spreader. The graphs show modeled data for an embodiment in which the grid elements 713b were assumed to each have a width (along the x-direction) of 0.5 mm, and were assumed to have a pitch (center-to-center spacing along the x-direction) of 5.0 mm. The grid elements 713a, 713b were further assumed to be composed of aluminum. The carbon nanolayer 714 was assumed to have a thickness of 20 nm, with a conductivity that could be selected or adjusted by the model. The PDLC layer 730 was assumed to have a thickness of 3 micrometers. The ITO layer 724 was assumed to be an electrically grounded plane.

A modulating voltage was then applied by the model between the grid 712a and the ITO layer 724, and the strength of the electric field was calculated in a reference plane proximate the carbon nanolayer 714, as a function of position x measured relative to the reference axis or plane 717. Due to symmetry considerations resulting from the repetitive arrangement of the grid elements 713b along the x-axis every 5 mm, the calculation was made for positions ranging from −2.5 mm to +2.5 mm. In this model, the field strength is a function of modulation frequency. Several different modulation frequencies were therefore modeled: FIG. 8a assumes a modulation frequency of 10 Hz, FIG. 8b assumes a modulation frequency of 100 Hz, and FIG. 8c assumes a modulation frequency of 1000 Hz. These frequencies were considered to be representative of frequencies that may be encountered in a typical liquid crystal switching device.

We turn then to the modeling results shown in FIGS. 8a through 8c. In FIG. 8a, curves 810a, 812a, 814a, and 816a assume a conductivity for the carbon nanolayer 714 of 0.003, 0.03, 0.3, and 3 Siemens/meter, respectively. In FIG.

8b, curves 810b, 812b, 814b, 816b, and 818b assume a conductivity for the carbon nanolayer 714 of 0.003, 0.03, 0.3, 3, and 30 Siemens/meter, respectively. In FIG. 8c, curves 810c, 812c, 814c, 816c, 818c, and 820c assume a conductivity for the carbon nanolayer 714 of 0.003, 0.03, 0.3, 3, 30, and 300 Siemens/meter, respectively. These results confirm our understanding that if the conductivity of the carbon nanolayer is too low, the electric field will be highly non-uniform as a function of position at the transparent conductive article, being strongest at or near the conductive grid elements and weakest at positions away from those elements. The results also confirm that if the conductivity of the carbon nanolayer is sufficiently high, the electric field will be substantially uniform. From these results, we may conclude that effective field spreading may be substantially achieved in most cases when the carbon nanolayer has a conductivity of at least about 30 Siemens/meter. For a buff coated carbon nanolayer having a thickness of 20 nanometers, this corresponds to a sheet resistance for the carbon nanolayer (in the absence of any grid) of less than $2 \times 10^6$ ohms/square.

Some liquid crystal switching devices similar to that depicted in FIGS. 7 and 7a were constructed to confirm our modeling results. To begin with, a commercially available shutter film, designated "V4" from Citala U.S. Inc., Sunnyvale, Calif., was obtained and used as a starting construction. This product construction uses two opposed PET films each having a transparent ITO conductor, and a connection pad at the edge of the film. Between these opposed films is sandwiched a layer of PDLC. The top film was then removed by gently peeling it from the construction, leaving the PDLC layer and the bottom film (with its transparent ITO conductor) intact. The resulting construction was then trimmed down to roughly a 3 inch by 3 inch section for easier handling, with the connection pad for the ITO layer on the bottom film left exposed (to permit electrical connection thereto) at one edge. Various transparent conductive films, described in the following paragraph, were then prepared and laminated by hand to the exposed surface of the PDLC layer of the trimmed-down construction so as to form various liquid crystal switching devices. Preparation of each transparent conductive film including cutting the film to a 3 inch by 3 inch piece to match the trimmed-down construction, and applying a silver paste to one edge to facilitate electrical connection to the top electrode of the laminated construction.

A first such liquid crystal switching device, referred to here as "switching device 1", had a construction substantially as shown in FIG. 7a, except that the transparent conductive article 702 was replaced with a transparent conductive article substantially similar to sample 917S discussed below. The transparent conductive article thus used a square-shaped grid pattern rather than the comb-shaped grid pattern of FIG. 7. A second such device, referred to here as "switching device 2", used a transparent conductive article similar to that in switching device 1, except that the carbon nanolayer on the upper transparent conductive article was entirely omitted. A third such device, referred to here as "switching device 3", used a transparent conductive article similar to that in switching device 1, except that the conductive grid on the upper transparent conductive article was entirely omitted, while retaining the carbon nanolayer. A fourth such device, referred to here as "switching device 4", used as the upper transparent conductive article a PET film on which a uniform (non-patterned) ITO coating was provided, with no conductive grid and no carbon nanolayer. Light scattering through these four switching devices was measured using a Haze-Gard Plus hazemeter, commercially available from BYK Instruments, Columbia, Md. The four switching devices were tested at different levels of applied voltage (0 volts, 50 volts, and 75 volts) across the front and back electrodes. Switching device 1 had a measured haze (spatially averaged over areas occupied by the grid elements and intermediate areas) of 99.6%, 13.3%, and 9.85% at 0, 50, and 75 volts respectively. Switching device 2 had a measured haze (spatially averaged over areas occupied by the grid elements and intermediate areas) of 99.5%, 95.2%, and 94.8% at 0, 50, and 75 volts respectively. Switching device 3 had a measured haze (spatially averaged over areas occupied by the carbon nanolayer) of 99.6%, 99.6%, and 97.3% at 0, 50, and 75 volts respectively. Switching device 4 had a measured haze (spatially averaged over areas occupied by the grid elements and intermediate areas) of 99.2%, 9.97% and 8.47% at 0, 50, and 75 volts respectively. These results confirm the function of the carbon nanolayer as a field spreading layer for the conductive grid.

A number of articles having a carbon nanolayer were made using the buff coating process described in connection with FIGS. 1 and 2, and the sheet resistance and percent transmission at 550 nm of the samples was measured. For a substrate (see e.g. elements 110 and 210 in FIGS. 1 and 2), each of the samples used a transparent, flexible PET film having a nominal thickness of 50 micrometers. This PET film by itself, with no coatings applied, has a percent transmission for normally incident visible light of about 90% due to Fresnel reflections at the front and back air/polymer interfaces. Different samples of this film were provided with a carbon nanolayer according to the process generally described in connection with FIG. 1. The nanolayers of these different samples were made to have a range of different coating thicknesses, and different dry composition starting materials were used. Datapoints 910 represent samples that were made using the HSAG300 material referenced elsewhere herein as the dry composition. Datapoints 912 represent samples that were made using TIMREX F10 Primary Synthetic graphite, available from Timcal, as the dry composition. Datapoints 914 represent samples that were made using M850, obtained from Asbury Carbons, Asbury, N.J., as the dry composition. The particles comprise crystalline flakes that have an average size of approximately 5 microns. The overall distribution of all of these datapoints along the percent transmission axis and along the sheet resistance axis is chiefly associated with the thickness of the carbon nanolayer that was formed on the substrate. For example, for the datapoint 912 having a transmission of about 27%, the thickness of the carbon nanolayer was about 75 nm. For the two datapoints 910 having a sheet resistance of about $10^{12}$ ohms/square, the thickness of the carbon nanolayer was measured to be about 3 nm using Transmission Electron Microscopy (TEM).

The datapoints 910, 912, and 914 are associated with samples having a PET substrate and a buff coated carbon nanolayer, but having no conductive grid. Datapoint 917 is associated with a sample that further included a metal grid, according to the process of FIG. 2 and the article of FIG. 3. This sample, referred to herein as "917S", utilized the flexible PET film as a substrate. A metal grid was then printed on this film. This grid was printed using nano-silver flexographic ink obtained from PChem Associates Inc., Bensalem, Pa. The pattern used for the grid was a square array as shown generally in FIG. 4a. The width of the lines or grid segments was 25 micrometers, and the pitch was 1 millimeter in both the x- and y-directions. The percent open area was approximately 97%. After drying, the thickness of the metal grid was about 250 nm. The PET film with this metal grid coated onto it then formed an intermediate article to which a dry composition was applied and buffed to form the carbon nanolayer. The dry composition that was used was a powder mixture of M850 graphite and Magenta pigment-encapsulated microspheres, MG-MP5518, obtained from Radiant Color N.V., Europark, Belgium. Using this dry composition, the buff coating process produced a carbon nanolayer having a thickness of less than 10 nm and greater than 1 nm.

Figure 10:
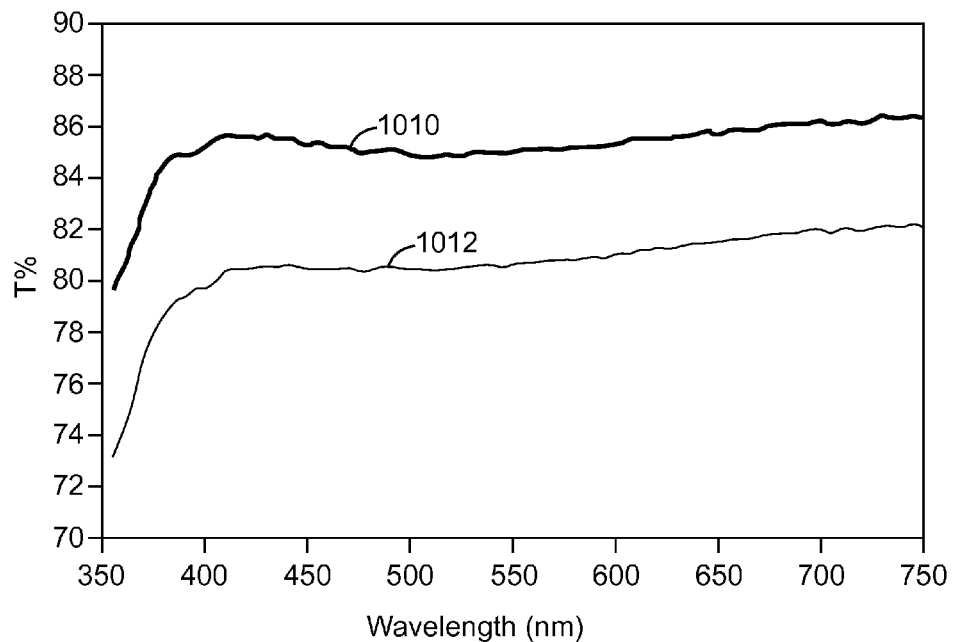
FIG. 10 is a graph of measured percent transmission versus optical wavelength for two electrically conductive articles that were constructed.

Using a Perkin Elmer Lambda 19 spectrophotometer, the resulting sample 917S was then measured for percent transmission as a function of wavelength from 350 to 750 nm. The measured percent transmission is shown by curve 1012 in FIG. 10. FIG. 10 also includes a curve 1010, which represents the intermediate article precursor of sample 917S before the carbon nanolayer was formed on the metal grid. Comparison of curves 1010 and 1012 reveals the effect of the carbon nanolayer on the spectral transmission of the finished sample. Note that the sample 917S exhibits a percent transmission that is at least about 80% over substantially the entire visible range from 400-700 nm, and that the percent transmission at 550 nm is greater than 80%, and that the average percent transmission over the range from 400-700 nm is also greater than 80%.

The sheet resistance of the sample 917S was measured with a four-probe contact resistance setup. The resistance was measured to be 11.8 ohms/square. The sheet resistance of the intermediate article precursor of sample 917S, before the carbon nanolayer was formed, was also measured in a similar way, and measured to be substantially the same 11.8 ohms/square.

Figure 9:
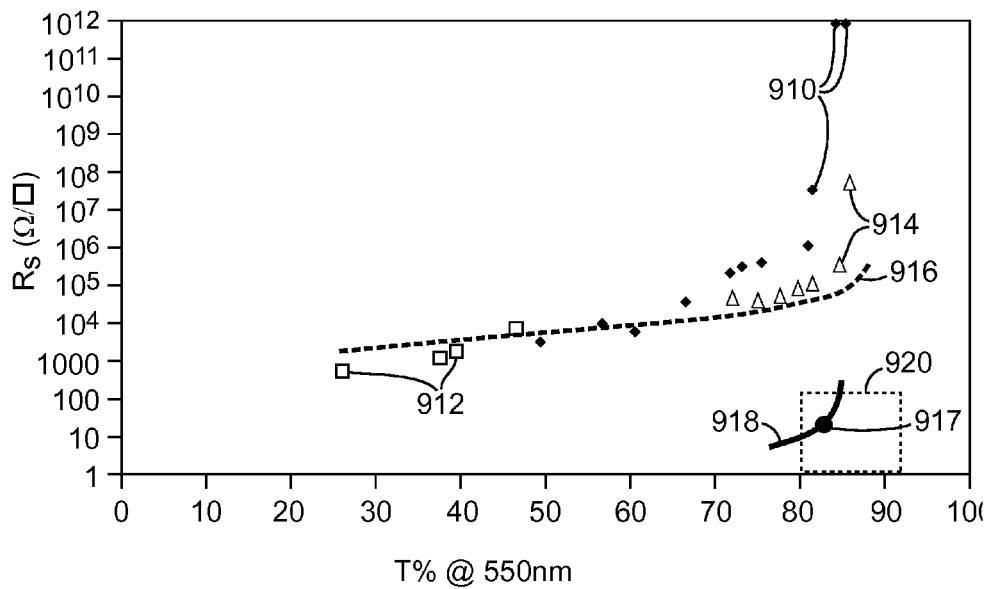
FIG. 9 is a graph of sheet resistance versus percent transmission.

Datapoint 917 in FIG. 9 thus represents the measured characteristics of the transparent conductive article sample 917S, whose sheet resistance was 11.8 ohms/square and whose percent transmission at 550 nm was about 81%.

Figure 11:
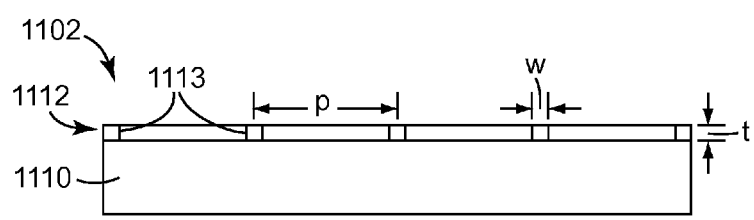
FIG. 11 is a schematic side- or cross-sectional view of a transparent conductor, the figure identifying the design parameters of the pitch p between neighboring segments of an electrically conductive grid, the width w of those grid segments, and the thickness t of the grid segments.
Figure 12:
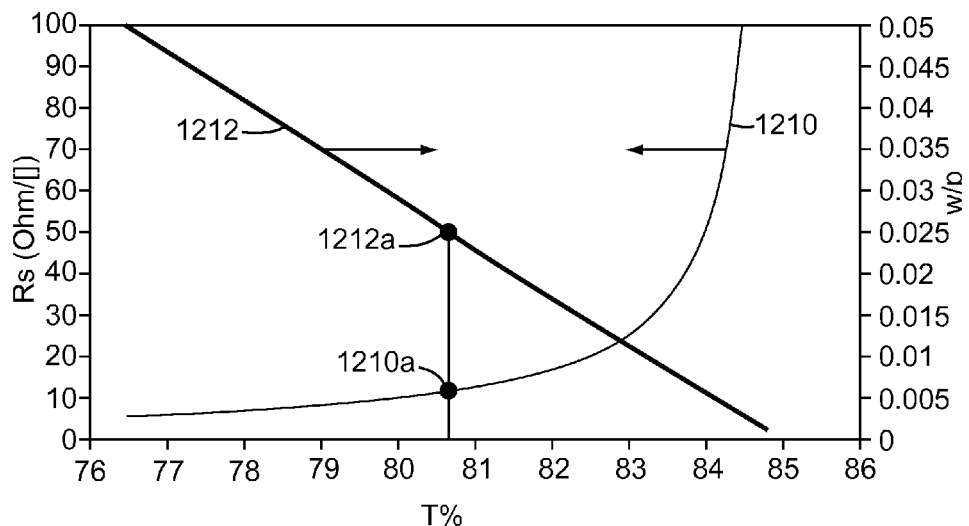
FIG. 12 is a hybrid graph showing both sheet resistance versus percent transmission, and showing the ratio w/p versus percent transmission.

With the measured sheet resistance of the uncoated metal grid sample and information from the sample 917S and the information from the datapoints 910, 912, and 914, we can model or predict the pertinent characteristics of transparent conductive articles similar to sample 917S, but having different conductive grid designs. For this purpose, we can use information from the optical constants of graphite known in the open literature and use thin film optics calculations, to generate a computed curve 916 that provides a functional relationship between percent transmission and sheet resistance of the carbon nanolayer by itself. To supplement this information, we can analyze geometrical aspects of the square grid design used for sample 917S. Reference in this regard is made to FIG. 11. In this figure, transparent conductive article 1102 has a substrate 1110 on which is formed a metal grid 1102 and a carbon nanolayer (not shown). The grid 1102 has grid elements 1113 that, in connection with a square grid pattern like that of sample 917S, can be characterized by a thickness "t", a width "w", and a pitch "p". In the case of sample 917S, as described above, w=25 microns, and p=1 mm. With this model in mind, we can plot sheet resistance versus percent transmission, together with a parameter w/p (width w divided by pitch p) versus the same percent transmission. Such a plot is shown in FIG. 12. In this graph, datapoints 1210a and 1212a represent the properties of the sample 917S, which had a percent transmission of about 80 to 81%, a sheet resistance of 11.8 ohms/square, and a value of w/p of 0.025. The line 1212, which can be calculated using geometrical principles, shows how changing the ratio w/p, by appropriate selection of w and p in the grid design, changes the percent transmission of the article, as the result of having greater or lesser percent open area based on w/p. Other software can be used to model the sheet resistance of a square grid having a given modified value of w/p. This result can be combined with the information from curve 916 to yield a predicted or computed sheet resistance as a function of percent transmission, shown as curve 1210 in FIG. 12 and as curve 918 in FIG. 9.

Curve 918 in FIG. 9 thus represents transparent conductive articles that can be made by modifying the metal grid design parameters of the tested sample 917S. This curve can be seen to partially overlap with design space 920. Design space 920 represents a desired range of sheet resistance (less than 100 ohms/square) and of percent transmission (at least 80%) that is considered desirable for visual display applications, such as liquid crystal displays.

Figure 13:
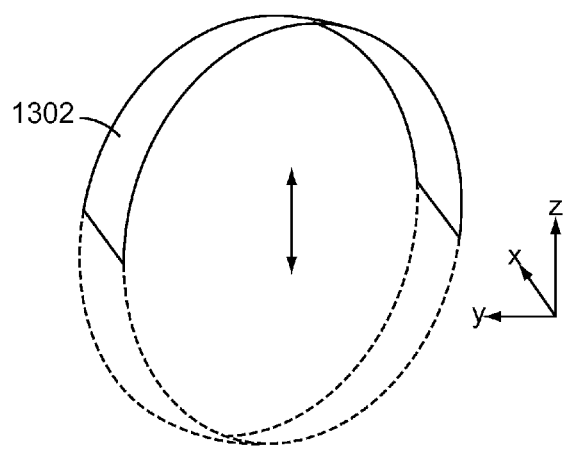
FIG. 13 is a schematic illustration of a flexible conductive article being flexed.

One characteristic that may be considered important in some applications is the ability of a transparent conductive article to retain its resistance after being flexed for an extended period of time. FIG. 13 schematically illustrates a transparent conductive article 1302 in the process of being flexed. In this illustration, the article 1302 is flexed in the y-z plane, but flexing may also be carried out in the perpendicular x-z plane. The flexing may be characterized by the frequency of the flexing, the duration of the flexing, and the bend radius (or bend diameter) that the article is subjected to during flexing.

Figure 13A:
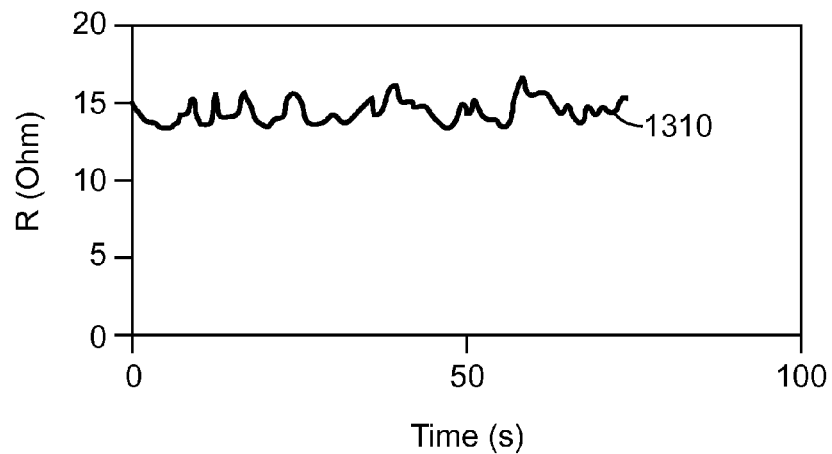
FIG. 13a is a graph of measured resistance of a flexible conductive article as disclosed herein versus time being subjected to flexing characterized by a bending diameter of 1 cm.
Figure 13B:
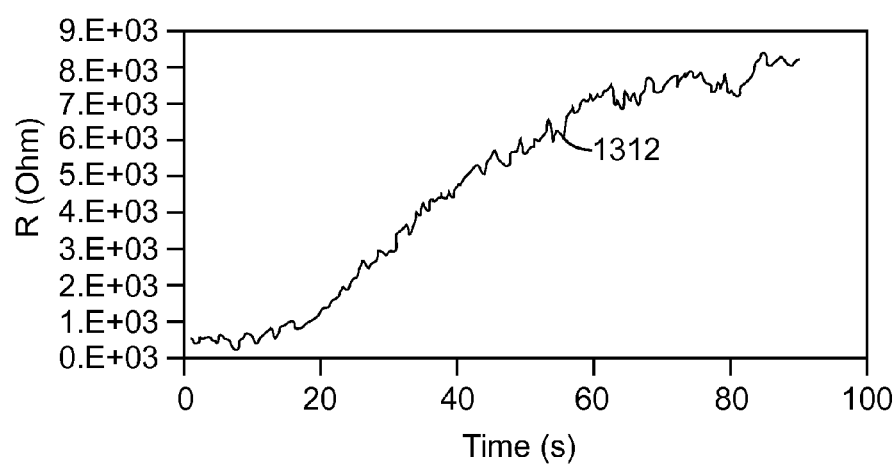
FIG. 13b is a graph of measured resistance versus time subjected to flexing similar to FIG. 13a, but for a transparent conductor that utilizes ITO.

A sample of a transparent conductive article was obtained. Electrical contacts were made with two copper tapes about 3 inches apart on the conductive side of the sample, and these tapes were connected to a digital multimeter set to measure resistance. The sample was held between two fingers and flexed quickly (approximately 1 back-and-forth flex cycle per second while the resistance was measured. The flexing was characterized by a minimum bend diameter at the center of the sample of about 1 centimeter. Curve 1310 in FIG. 13a shows the results of this testing during a period of about 60 seconds. Curve 1312 in FIG. 13b shows the results of a substantially similar flexing test that was performed on a sample of commercially available transparent conductive article, namely, EL1500, ORGACON from AGFA a PET film coated with ITO. Curve 1310a shows that the initial resistance (and the initial sheet resistance) of the sample is substantially maintained during and after the flexing test. For example, the resistance and sheet resistance of the sample does not increase beyond twice its initial value after 60 seconds of the flexing. In contrast, the curve 1312 shows that the ITO sample exhibits an irreversible increase in resistance of more than 1600% after 60 seconds.

Unless otherwise indicated, all numbers expressing quantities, measurement of properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application. Not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, to the extent any numerical values are set forth in specific examples described herein, they are reported as precisely as reasonably possible. Any numerical value, however, may well contain errors associated with testing or measurement limitations.

Various modifications and alterations of this invention will be apparent to those skilled in the art without departing from the spirit and scope of this invention, and it should be understood that this invention is not limited to the illustrative embodiments set forth herein. For example, the disclosed transparent conductive articles may also include an anti-reflective coating and/or a protective hard coat. The reader should assume that features of one disclosed embodiment can also be applied to all other disclosed embodiments unless otherwise indicated. It should also be understood that all U.S. patents, patent application publications, and other patent and non-patent documents referred to herein are incorporated by reference, to the extent they do not contradict the foregoing disclosure.

The invention claimed is:

1. A transparent conductive article, comprising:
    a transparent substrate; and
    an electrically conductive grid disposed on the substrate, wherein the grid has a thickness of no more than 1 micrometer and wherein the grid is composed of a material other than ITO and has a conductivity of at least $10^4$ Siemens/meter; and
    a carbon nanolayer disposed on the substrate and in contact with the grid, the carbon nanolayer having a thickness of no more than 50 nanometers;
    wherein the carbon nanolayer has a morphology comprising graphite platelets embedded in nano-crystalline carbon.

2. The article of claim 1, wherein the article has a spatially averaged optical transmission of at least 80% at 550 nm.

3. The article of 1, wherein the carbon nanolayer and the grid provide the article with a sheet resistance less than 50 ohms/square.

4. The article of claim 1, wherein the article is flexible, wherein the carbon nanolayer and the grid provide the article with a sheet resistance, and wherein the sheet resistance is substantially maintained upon subjecting the article to flexing characterized by a bending diameter of 1 cm.

5. The article of claim 4, wherein, after 60 seconds of the flexing, the sheet resistance does not increase beyond two times an initial value of the sheet resistance.

6. The article of claim 1, wherein the grid is disposed between the substrate and the carbon nanolayer.

7. The article of claim 1, wherein the carbon nanolayer is disposed between the substrate and the grid.

8. The article of claim 1, wherein the grid is configured in a regular repeating pattern.

9. The article of claim 1, wherein the grid has a percent open area of at least 90%.

10. The article of claim 1, wherein the grid material comprises a metal selected from aluminum, silver, gold, copper, nickel, titanium, chromium, indium, and alloys thereof.

11. The article of claim 1, wherein the carbon nanolayer functions as an electric field spreading layer.

12. The article of claim 1, wherein the article has a first dimension along a first in-plane axis of at least 1 meter, and the article has a second dimension along a second in-plane axis of at least 0.1 meter, the first and second in-plane axes being orthogonal.

13. A method of making a transparent conductive article, comprising:
    providing a first substrate;
    forming an electrically conductive grid on the substrate to provide an intermediate article, the grid having a thickness of no more than 1 micrometer and wherein the grid is composed of a material other than ITO and has a conductivity of at least $10^4$ Siemens/meter;
    applying a dry composition comprising carbon particles to the intermediate article; and
    buffing the dry composition on the intermediate article to form a transparent carbon nanolayer that covers the grid and the substrate, while maintaining the grid's physical integrity,
    wherein the carbon nanolayer has a morphology comprising graphite platelets embedded in nano-crystalline carbon.

14. The method of claim 13, wherein the first substrate comprises a transparent flexible film.

15. The method of claim 13, wherein the carbon nanolayer has a thickness of no more than 50 nm.

16. The method of claim 14, wherein the first substrate comprises a release liner.

17. The method of claim 13, further comprising:
    transferring the grid and the transparent carbon nanolayer from the first substrate to a second substrate.

18. The method of claim 17, wherein the second substrate comprises a transparent flexible film.

* * * * *

UNITED STATES PATENT AND TRADEMARK OFFICE
CERTIFICATE OF CORRECTION

PATENT NO. : 9,668,333 B2  
APPLICATION NO. : 14/356914  
DATED : May 30, 2017  
INVENTOR(S) : Divigalpitiya et al.

It is certified that error appears in the above-identified patent and that said Letters Patent is hereby corrected as shown below:

On the Title Page

Page 2, Column 2,
Item (56), Under "U.S. Patent Documents," Line 15, after "Kishioka" insert -- et al. --.

In the Specification

Column 1,
Line 8, delete "371" and insert -- §371 --, therefor.

In the Claims

Column 19,
Line 31, in Claim 3, delete "1," and insert -- claim 1, --, therefor.

Signed and Sealed this
First Day of August, 2017

Joseph Matal
*Performing the Functions and Duties of the*
*Under Secretary of Commerce for Intellectual Property and*
*Director of the United States Patent and Trademark Office*